(12) United States Patent
Mochizuki et al.

(10) Patent No.: US 12,250,835 B2
(45) Date of Patent: Mar. 11, 2025

(54) ISOLATION BETWEEN VERTICALLY STACKED NANOSHEET DEVICES

(71) Applicant: INTERNATIONAL BUSINESS MACHINES CORPORATION, Armonk, NY (US)

(72) Inventors: Shogo Mochizuki, Mechanicville, NY (US); Sanjay C. Mehta, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 17/654,412

(22) Filed: Mar. 11, 2022

(65) Prior Publication Data

US 2023/0290776 A1    Sep. 14, 2023

(51) Int. Cl.
*H10D 84/83*    (2025.01)
*H10D 84/03*    (2025.01)
(Continued)

(52) U.S. Cl.
CPC ........... *H10D 84/83* (2025.01); *H10D 84/038* (2025.01); *H10D 86/01* (2025.01); *H10D 87/00* (2025.01); *H10D 88/01* (2025.01)

(58) Field of Classification Search
CPC ............... H01L 27/088; H01L 21/8221; H01L 29/1029; H01L 25/071; H01L 21/02603; H01L 29/66545; H01L 21/84; H01L 27/1207; H01L 29/0673; H01L 21/823468; H01L 21/823481; H01L 27/0688;
(Continued)

(56) References Cited

U.S. PATENT DOCUMENTS 10,243,043 B2 *    3/2019    Mochizuki ........ H01L 29/42392
10,381,438 B2 *    8/2019    Zhang ............... H01L 29/66742
(Continued)

FOREIGN PATENT DOCUMENTS

EP    4141919 A1 *    3/2023    ............. H01L 21/32

OTHER PUBLICATIONS

Huang et al., "3-D Self-aligned Stacked NMOS-on-PMOS Nanoribbon Transistors for Continued Moore's Law Scaling", © 2020 IEEE, IEDM20, pP. 20.6.1-20.6.4.

*Primary Examiner* — Mohammed Shamsuzzaman
(74) *Attorney, Agent, or Firm* — Yuanmin Cai

(57)    ABSTRACT

A lower nanosheet stack including alternating layers of a first work function metal and a semiconductor channel material, an upper nanosheet stack including alternating layers of a second work function metal and the semiconductor channel material, one or more dielectric layers between the lower nanosheet stack and the upper nanosheet stack, each separated by an inner spacer. An embodiment where the one or more partial dielectric layers each include an opening. Forming an upper nanosheet stack vertically aligned above an intermediate stack, vertically aligned above a lower nanosheet stack, the upper nanosheet stack, the lower nanosheet stack each including alternating layers of a first sacrificial material and a semiconductor channel material, the intermediate stack including one or more alternating layers of the sacrificial material and a second sacrificial material, recessing the second sacrificial material; and forming second inner spacers where the second sacrificial material was recessed.

17 Claims, 27 Drawing Sheets

Section X-X

(51) Int. Cl.
  *H10D 86/01*   (2025.01)
  *H10D 87/00*   (2025.01)
  *H10D 88/00*   (2025.01)

(58) Field of Classification Search
  CPC ............. H01L 29/66439; H01L 29/775; H01L 21/823842; H01L 21/823878; H01L 27/092; H01L 29/78696; H01L 29/42392; B82Y 10/00
  USPC ........................................... 257/401; 438/284
  See application file for complete search history.

(56) References Cited

U.S. PATENT DOCUMENTS

| | | | | |
|---|---|---|---|---|
| 10,636,791 | B1 * | 4/2020 | Rubin | H01L 21/823885 |
| 11,069,684 | B1 * | 7/2021 | Xie | H01L 21/823871 |
| 11,152,360 | B2 * | 10/2021 | Barraud | H01L 27/092 |
| 11,195,832 | B2 * | 12/2021 | Gardner | H01L 21/8221 |
| 11,502,169 | B2 * | 11/2022 | Xie | H01L 29/78696 |
| 11,776,856 | B2 * | 10/2023 | Hall | H01L 29/0665 257/401 |
| 11,776,960 | B2 * | 10/2023 | Khaderbad | H01L 27/092 257/368 |
| 11,888,044 | B2 * | 1/2024 | Park | H01L 29/78618 |
| 2016/0027929 | A1 * | 1/2016 | Cheng | H01L 29/1037 438/151 |
| 2016/0141366 | A1 * | 5/2016 | Lai | H01L 29/7869 438/157 |
| 2019/0131396 | A1 * | 5/2019 | Zhang | H01L 21/02236 |
| 2019/0348403 | A1 * | 11/2019 | Mochizuki et al. | H01L 25/071 |
| 2020/0006331 | A1 * | 1/2020 | Lilak | H01L 29/66545 |
| 2020/0020768 | A1 * | 1/2020 | Lee | H01L 27/092 |
| 2020/0105751 | A1 * | 4/2020 | Dewey | H01L 21/8256 |
| 2020/0294866 | A1 * | 9/2020 | Cheng | H01L 21/28088 |
| 2021/0210349 | A1 | 7/2021 | Xie | |
| 2022/0352386 | A1 * | 11/2022 | Yu | H01L 29/775 |
| 2022/0367658 | A1 * | 11/2022 | Yim | H01L 29/0673 |
| 2023/0037957 | A1 * | 2/2023 | Thomas | H01L 27/0922 |
| 2023/0307495 | A1 * | 9/2023 | Mehta | H01L 27/088 |
| 2024/0014212 | A1 * | 1/2024 | Zhang | H01L 21/82385 |

\* cited by examiner

Section X-X

Section Y1-Y1

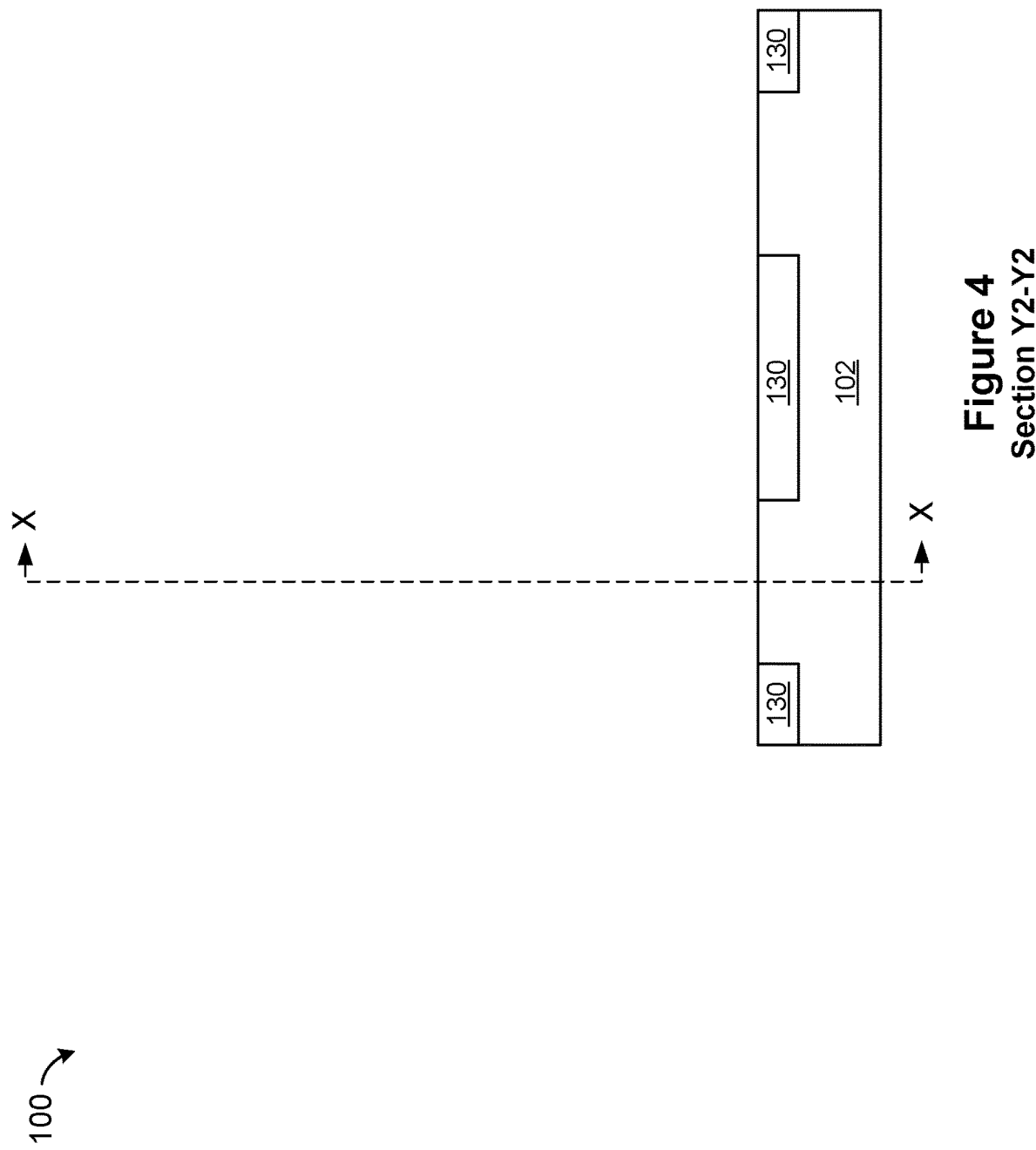

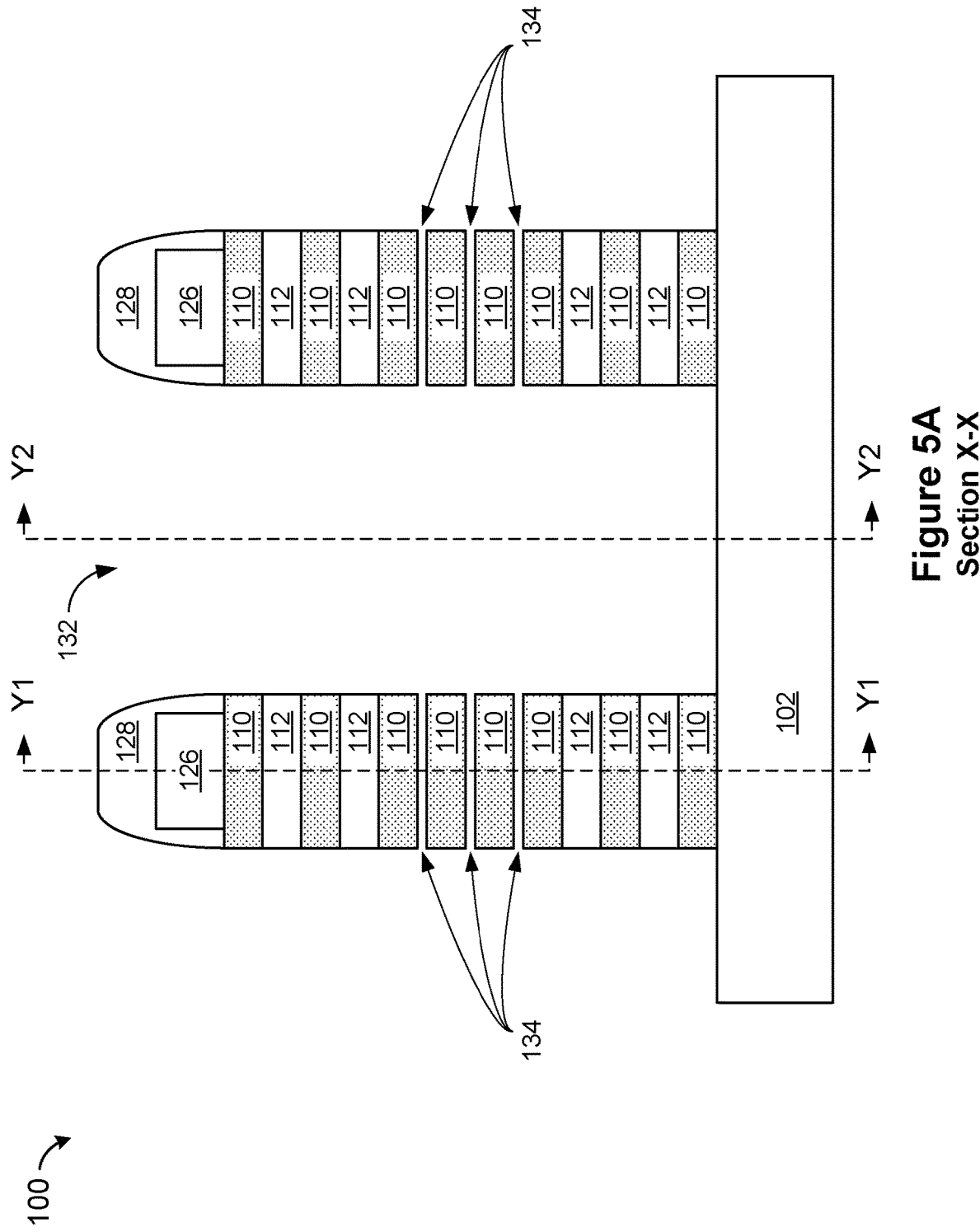

Section X-X

Section Y1-Y1

Section X-X

Section X-X

Section Y1-Y1

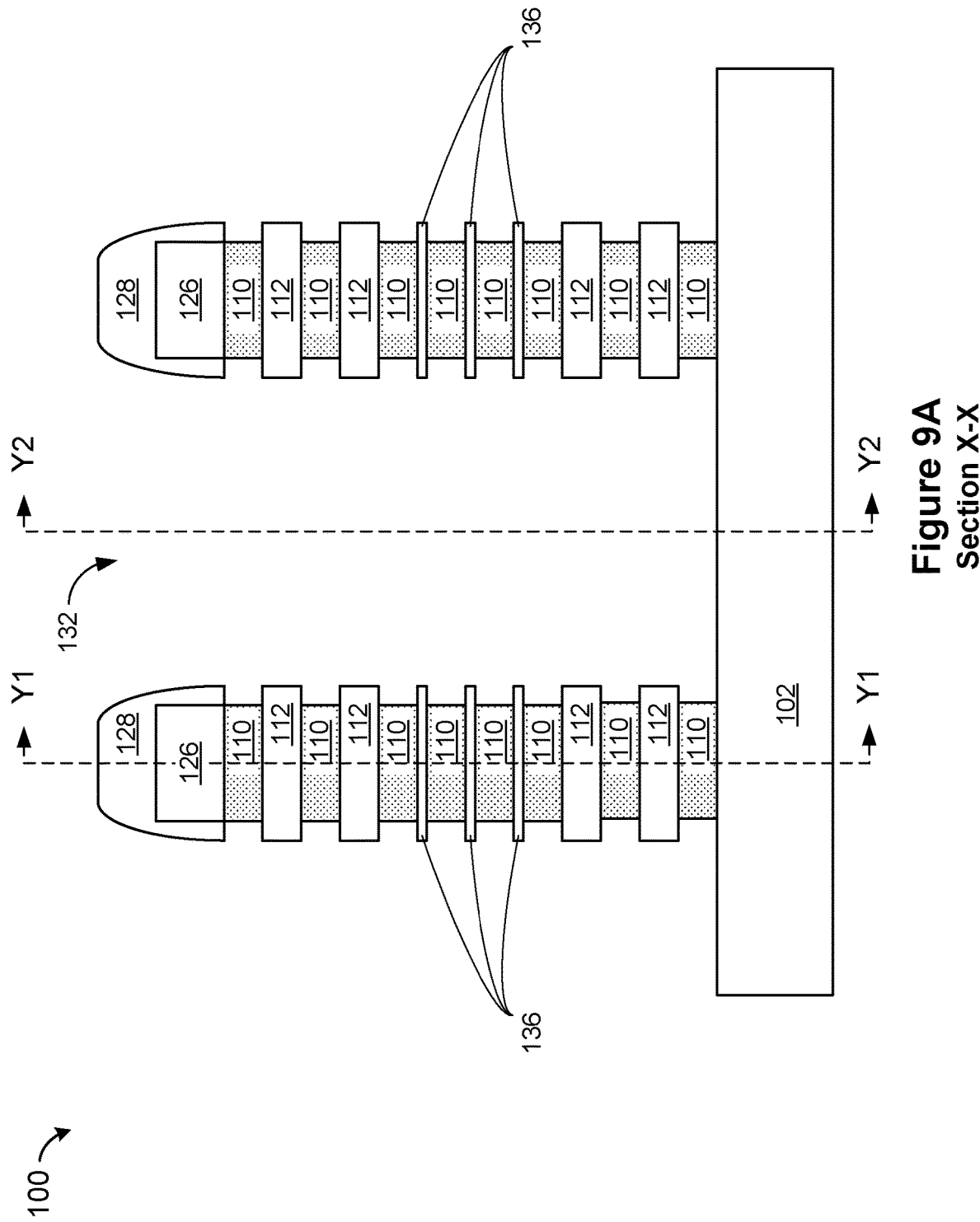

Section X-X

Section X-X

Section X-X

Section Y2-Y2

Section X-X

Section Y1-Y1

Section Y2-Y2

Section X-X

Section X-X

Section Y1-Y1

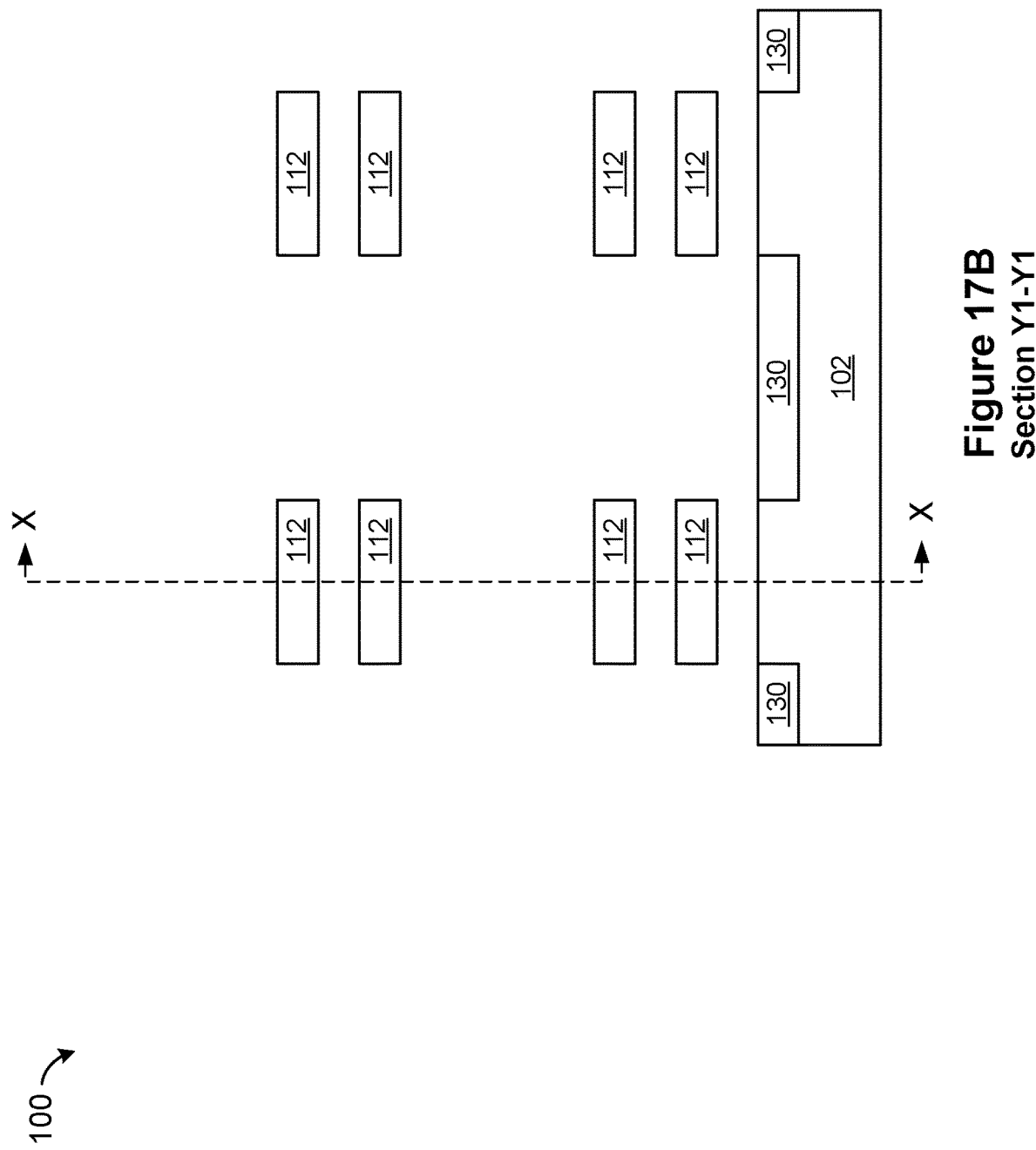

Section X-X

Section X-X

Section Y1-Y1

Section Y1-Y1

Section Y2-Y2

ISOLATION BETWEEN VERTICALLY STACKED NANOSHEET DEVICES

BACKGROUND

The present invention relates, generally, to the field of semiconductor manufacturing, and more particularly to isolation between stacked nanosheet field effect transistors.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. Nanosheet FETs help to reduce FET device footprint while maintaining FET device performance. A nanosheet device contains one or more layers of semiconductor channel material portions having a vertical thickness that is substantially less than its width. A nanosheet FET includes a plurality of stacked nanosheets extending between a pair of source/drain epitaxial regions. The device may be a gate all around device or transistor in which a gate surrounds a portion of the nanosheet channel.

SUMMARY

According to an embodiment, a semiconductor device is provided. The semiconductor device including a nanosheet stack, the nanosheet stack including a lower nanosheet stack on a substrate including alternating layers of a first work function metal and a semiconductor channel material vertically aligned and stacked one on top of another, an upper nanosheet stack including alternating layers of a second work function metal and the semiconductor channel material vertically aligned and stacked one on top of another, the upper nanosheet stack vertically aligned and stacked on top of the lower nanosheet stack, and one or more dielectric layers between the lower nanosheet stack and the upper nanosheet stack, the one or more dielectric layers each separated from each other by an inner spacer.

According to an embodiment, a semiconductor device is provided. The semiconductor device including a nanosheet stack, the nanosheet stack including a lower nanosheet stack on a substrate including alternating layers of a first work function metal and a semiconductor channel material vertically aligned and stacked one on top of another, an upper nanosheet stack including alternating layers of a second work function metal and the semiconductor channel material vertically aligned and stacked one on top of another, the upper nanosheet stack vertically aligned and stacked on top of the lower nanosheet stack, and one or more partial dielectric layers between the lower nanosheet stack and the upper nanosheet stack, the one or more dielectric layers each separated from each other by an inner spacer, the one or more partial dielectric layers each include an opening.

According to an embodiment, a method is provided. The method including forming a nanosheet stack on a substrate, the nanosheet stack including an upper nanosheet stack vertically aligned above an intermediate stack, the intermediate stack vertically aligned above a lower nanosheet stack, the upper nanosheet stack and the lower nanosheet stack each including alternating layers of a first sacrificial material and a semiconductor channel material vertically aligned and stacked one on top of another, the intermediate stack including one or more alternating layers of the sacrificial material and a second sacrificial material, recessing the second sacrificial material; and forming second inner spacers where the second sacrificial material was recessed.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIGS. 2, 3 and 4 each illustrate a cross-sectional view of the semiconductor structure of FIG. 1 along section lines X-X, Y1-Y1 and Y2-2, respectively, FIGS. 3 and 4 are parallel to each other, and FIG. 2 is perpendicular to FIGS. 3 and 4, according to an embodiment;

FIG. 5A illustrates a cross-sectional view of the semiconductor structure along section line X-X, and illustrates selective removal of select layers, according to an embodiment;

FIG. 9A illustrates a cross-sectional view of the semiconductor structure along section line X-X, and illustrates removal of select portions of layers, according to an embodiment;

FIG. 17B illustrates a cross-sectional view of the semiconductor structure along section line Y1-Y1, according to an alternate embodiment;

Figure 1:
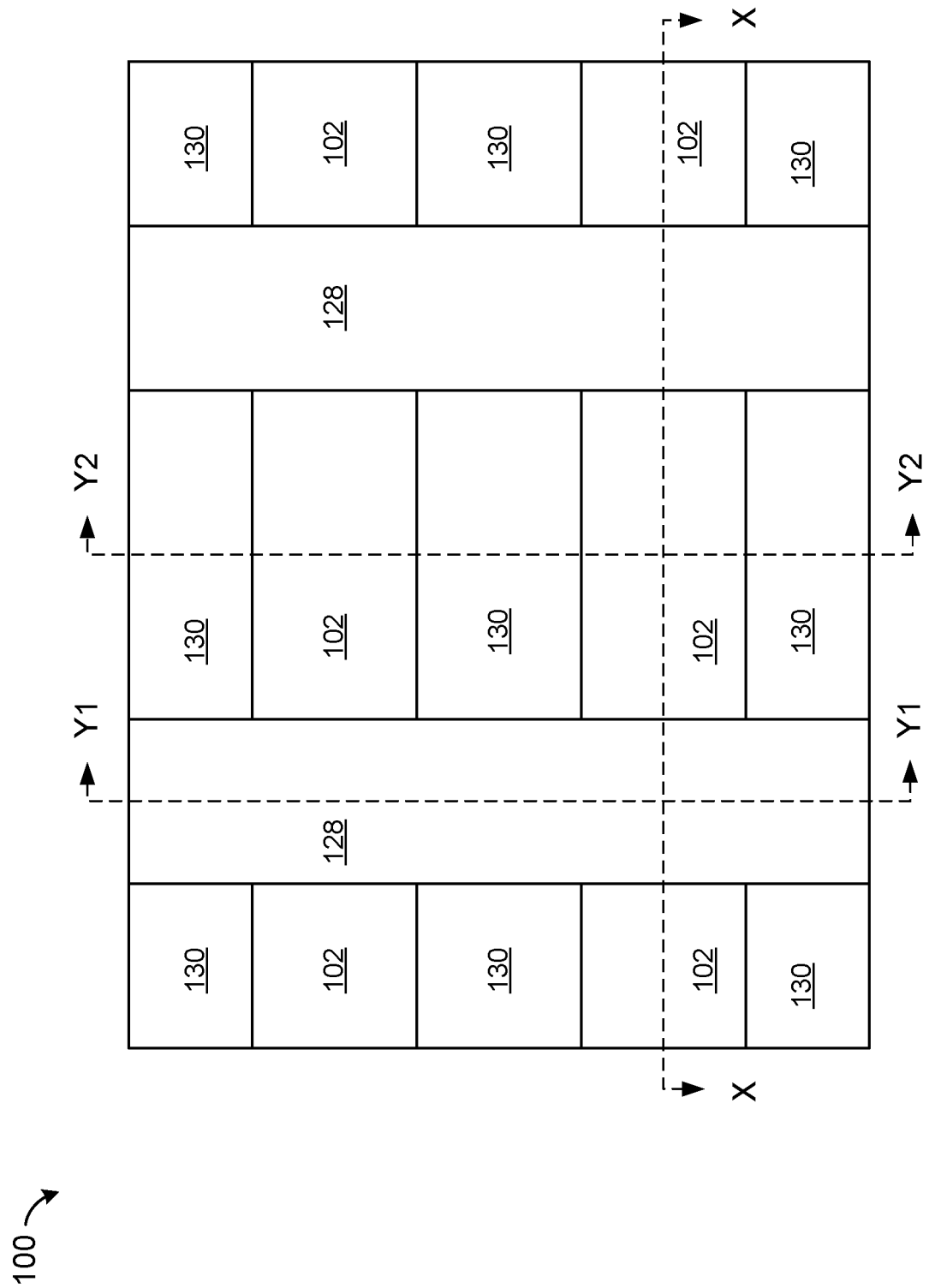
FIG. 1 illustrates a top view of a semiconductor structure at an intermediate stage of fabrication, according to an embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet field effect transistor (hereinafter "FET") may be formed from alternating layers of silicon and silicon germanium, which are then formed into stacked nanosheets. A gate all around structure may be formed on all vertical sides and on a horizontal top surface of a section of the nanosheets. Source-drain structures may be formed at the opposite ends of the stacked nanosheet structures.

Stacking two nanosheet FETs, with an isolation layer between them, is an approach for increasing density of FETs. The stacked nanosheet FET may include a negative channel FET (hereinafter "n-FET"), stacked on top of a positive channel FET (hereinafter "p-FET"), or the p-FET stacked on top of the n-FET. Alternatively, two n-FETs may be stacked on top of each other, or two p-FETs, may be stacked on top of each other.

Robust isolation is needed between the two stacked FETs for the stacked FETs to properly function. The robust isolation electrically and physically isolates the two stacked FETs from each other. A thin robust isolation helps to increase density of FETs structures.

Formation of an upper nanosheet FET device vertically stacked over a lower nanosheet FET device requires physical and electrical isolation with an insulator material in a gate and a source drain region. Formation of a thick insulator material between the upper nanosheet FET device and the lower nanosheet FET device helps to prevent an electrical short between the upper nanosheet FET and the lower nanosheet FET. A thick insulator material between the upper nanosheet FET device and the lower nanosheet FET device also provides enough space to fabricate a different high-k/ metal gate stack structure for each of the upper nanosheet stack and the lower nanosheet stack. It is challenging to form a thick insulator material between the upper nanosheet FET and the lower nanosheet FET.

There are challenges when forming a thick stack sacrificial layer formed between the upper nanosheet device and the lower nanosheet device. The stack sacrificial layer located between the upper and the lower FETs may be thicker than sacrificial layers located between channel layers within the FETs, and may be silicon germanium with a higher concentration of germanium than the silicon geranium of the sacrificial layers. The nanosheet layers may be separated into nanosheet stacks, and the stack sacrificial layer may be removed. When a conformal insulator material is deposited to fill a vertical space located between the upper nanosheet device and the lower nanosheet device, the conformal insulator may also fill a horizontal space located between adjacent nanosheet device stacks. This can cause problems with downstream processing of the nano device stacks.

An additional example of a challenge of forming a thick stack sacrificial layer between the upper and lower nanosheet devices, occurs when forming inner spacers. Outer portions of the sacrificial layers along with outer portions of the stack sacrificial layer may be removed and inner spacers formed where the portions of the stack sacrificial layer and portions of the sacrificial layers were removed. The material for the inner spacers may be conformally formed on the nanosheet stack. The material for the inner spacers is then etched back such that the inner spacer material only remains surrounding the end of the nanosheets within the nanosheet stack. The material of the inner spacer located next to the stack sacrificial layer is removed during the etch back of the inner spacer. This results in no inner spacer surrounding the stack sacrificial layer, which causes a short between the gate and the source drain.

The present invention for forming a thick stack sacrificial layer between the upper nanosheet FET and the lower nanosheet FET includes forming one or more layers between the upper nanosheet FET and the lower nanosheet FET. The one or more layers include one or more stack sacrificial layers, each separated by a sacrificial layer. Each of the sacrificial layers may be similar material and thickness of the sacrificial layers formed for both the upper nanosheet FET and the lower nanosheet FET. The stack sacrificial layers may each be a thin silicon germanium layer with a high concentration of germanium, which is different than the sacrificial layers of the entire nanosheet stack, which are each a silicon germanium layer with a low concentration of germanium. In the example illustrated below, between the lower nanosheet stack and the upper nanosheet stack, there is a stack sacrificial layer, a sacrificial layer, a stack sacrificial layer, a sacrificial layer and a stack sacrificial layer. In this embodiment there are three stack sacrificial layers each separated by a sacrificial layer. There may be more than or less than three stack sacrificial layers between the upper and lower nanosheet stacks.

The stacked sacrificial layers are selectively removed and replaced with a thin insulator. The sacrificial layers surrounding the stack sacrificial layers may have inner spacers formed simultaneously as the inner spacers as the sacrificial layers of other portions of the nanosheet stack. The inner spacers of the sacrificial layers between the upper and lower nanosheet stack remain due to the thin insulator layers when excess portions of the material of the inner spacers is removed. Additionally, the thin insulator layers may have a smaller thickness than the sacrificial layers, helping to limit a vertical height of the nanosheet structure. The additional vertical space of the thin insulator layers with sacrificial layers between them allows for formation of different work function metals and associated high k liners for each, for each of the upper and lower nanosheet stacks. The sacrificial layers located between the upper and lower nanosheet FET can be recessed when the sacrificial layers in the upper and lower nanosheet FET are recessed. This allows for the formation of an inner spacer between in recesses created above and below the thin insulator. The inner spacers provide for later formation of source and drain without direct connection to a gate, for each of the upper and lower nanosheet stacks.

In an alternate embodiment, the stack sacrificial layers may be recessed, rather than removed. A thin insulator may be formed as side spacers surrounding the remaining portions of the stack sacrificial layers. Further processing steps to remove the sacrificial layers of the upper and lower nanosheet stacks may also remove the remaining portions of the stack sacrificial layers. The formation of the work function metals may then entirely fill vertical space between the upper and the lower nanosheet stacks.

The present invention relates, generally, to the field of semiconductor manufacturing, and more particularly to isolation between vertically stacked nanosheet field effect transistors.

Embodiments of the present invention disclose a structure and a method of forming a double stacked FET nanosheet with robust isolation between the upper and lower stacked FET nanosheets are described in detail below by referring to the accompanying drawings in FIGS. 1-20, in accordance with an illustrative embodiment.

Figure 2:
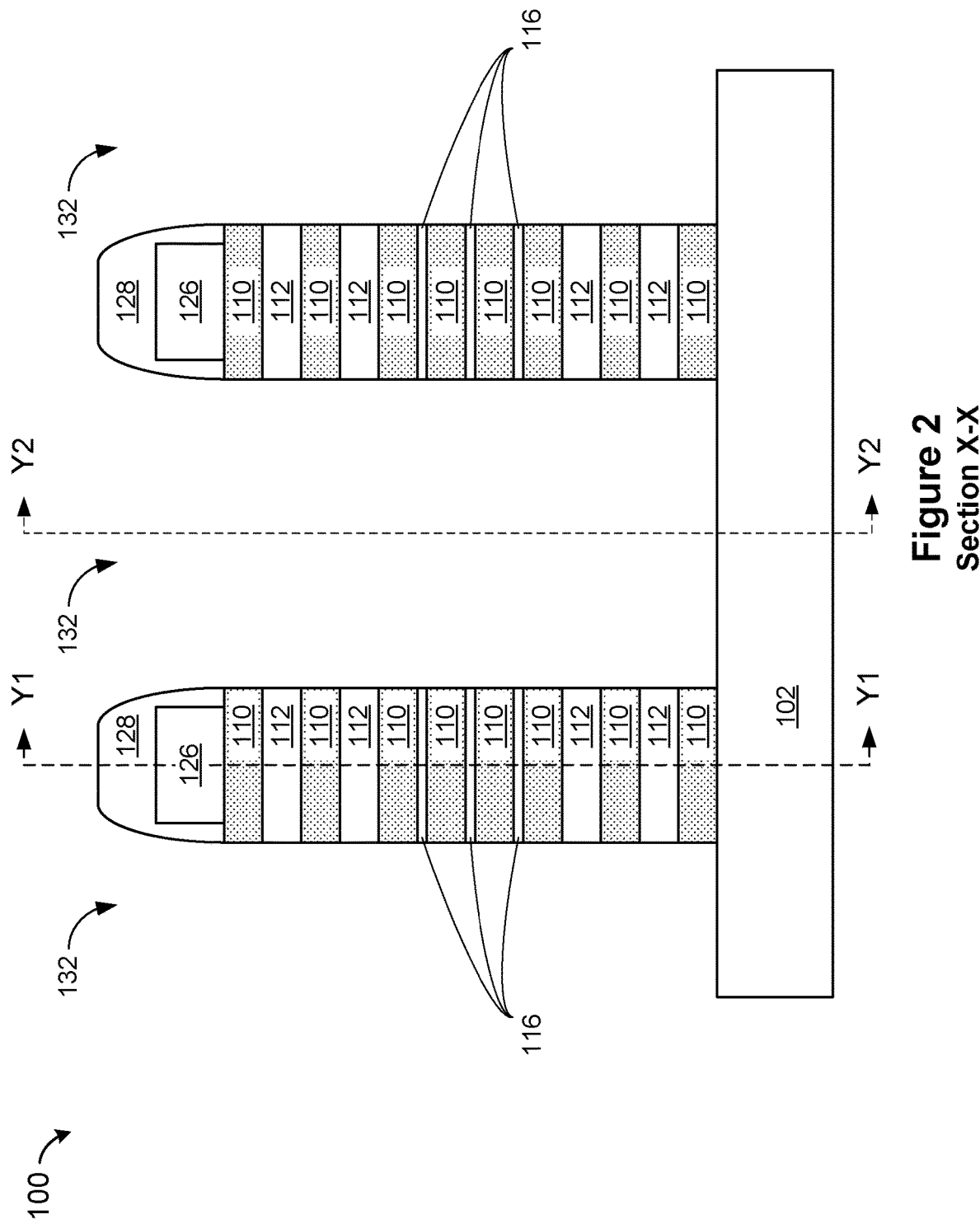
Figure 3:
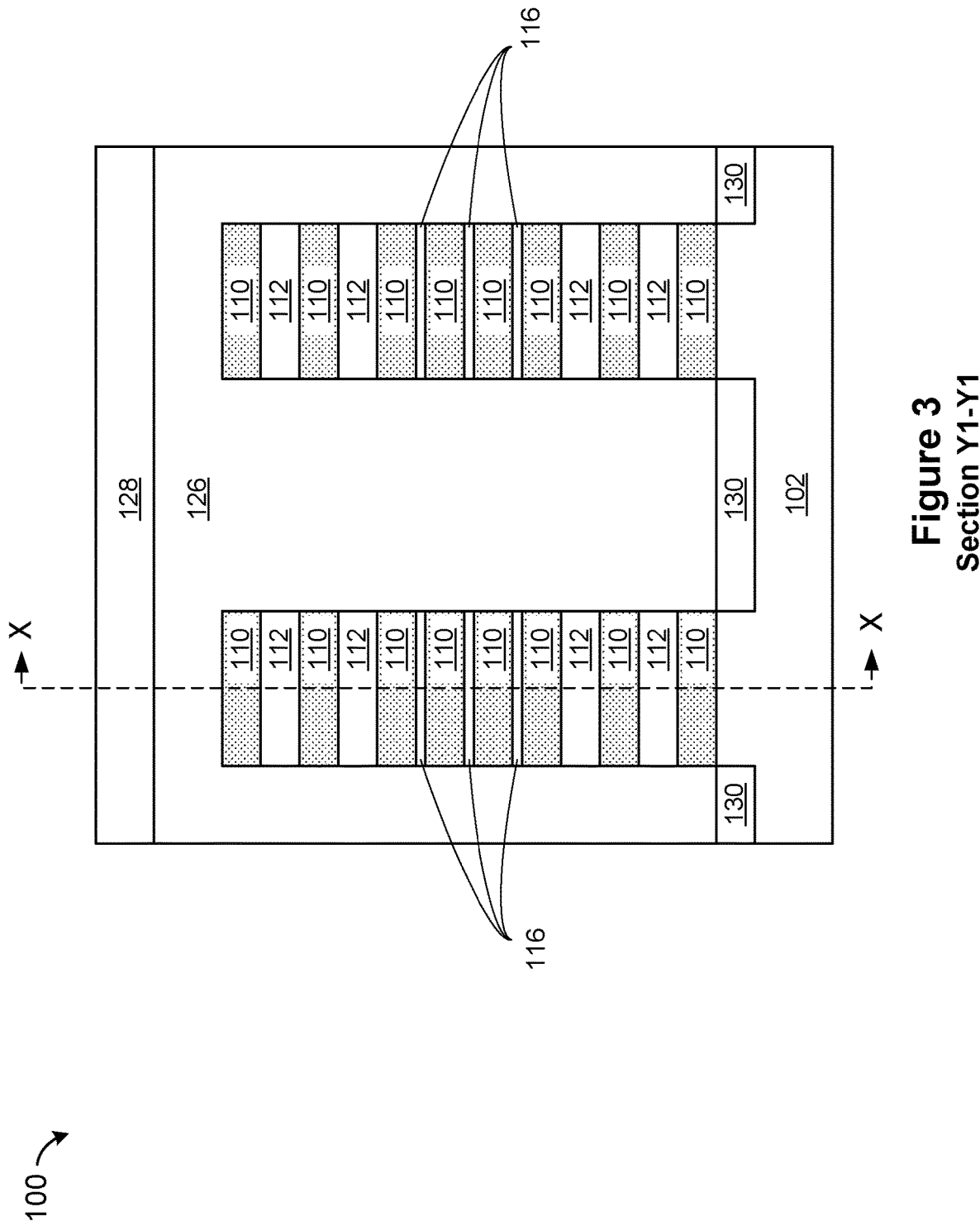

Referring now to FIGS. 1, 2, 3 and 4, a semiconductor structure 100 (hereinafter "structure") at an intermediate stage of fabrication is shown according to an exemplary embodiment. FIG. 1 is a top view of the structure 100. FIGS. 2, 3 and 4 are each a cross-sectional view of the structure 100 along section lines X-X, Y1-Y1 and Y2-2, respectively, FIGS. 3 and 4 are parallel to each other, and FIG. 2 is perpendicular to FIGS. 3 and 4. The structure 100 of FIG. 1 may be formed or provided.

The structure 100 may include alternating layers of sacrificial semiconductor material and semiconductor channel material stacked one on top of another, a shallow trench isolation region (hereinafter "STI") 130, a sacrificial gate 126 and a gate cap 128 on a substrate 102. It should be noted that, while a limited number of alternating layers are depicted, any number of alternating layers may be formed.

The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

The alternating layers of sacrificial semiconductor material and semiconductor channel material may include a sacrificial semiconductor material layer 110 (hereinafter "sacrificial layer"), covered by a semiconductor channel material layer 112 (hereinafter "channel layer"), covered by a sacrificial layer 110, covered by a channel layer 112, covered by a sacrificial layer 110, covered by a stack sacrificial layer 116, covered by a sacrificial layer 110, covered by a stack sacrificial layer 116, covered by a sacrificial layer 110, covered by a stack sacrificial layer 116, covered by a sacrificial layer 110, covered by a channel layer 112, covered by a sacrificial layer 110, covered by a channel layer 112, covered by a sacrificial layer 110.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

Each sacrificial layer 110 is composed of a first semiconductor material which differs in composition from at least an upper portion of the substrate 102, the channel layer 112 and the stack sacrificial layer 116. In an embodiment, each sacrificial layer 110 may be a silicon-germanium semiconductor alloy and have a germanium concentration less than 50 atomic percent. In another example, each sacrificial layer 110 may have a germanium concentration ranging from about 20 atomic percent to about 40 atomic percent. Each sacrificial layer 110 can be formed using known deposition techniques or an epitaxial growth technique as described above.

Each channel layer 112 is composed of a second semiconductor material which differs in composition from at least the upper portion of the substrate 102, the sacrificial layer 110 and the stack sacrificial layer 116. Each channel layer 112 has a different etch rate than the first semiconductor material of sacrificial layer 110 and has a different etch rate than the stack sacrificial layer 116. The second semiconductor material can be, for example, silicon. The second semiconductor material, for each channel layer 112 can be formed using known deposition techniques or an epitaxial growth technique as described above.

The stack sacrificial layers 116, may, for example, be silicon germanium with a germanium concentration about 60 atomic percent, although percentages greater than 60 percent and less than 60 percent may be used. The stack sacrificial layers 116 can each be formed using an epitaxial growth technique. The stack sacrificial layers 116 will each subsequently be removed selective to the remaining alternating layers, as described below.

The alternating layers of sacrificial layer 110, channel layers 112 and stack sacrificial layers 116 can be formed by sequential epitaxial growth of alternating layers of the first semiconductor material, the second semiconductor material and the nanosheet stack sacrificial layer material.

The sacrificial layers 110 may have a thickness ranging from about 5 nm to about 15 nm, and the channel layers 112 may have a thickness ranging from about 3 nm to about 15 nm. Each sacrificial layer 110 may have a thickness that is the same as, or different from, a thickness of each channel layer 112. In an embodiment, each sacrificial layer 110 has an identical thickness. In an embodiment, each channel layer 112 has an identical thickness. The stack sacrificial layers 116 may each have a thickness ranging from about 3 nm to about 15 nm.

The alternating layers of sacrificial layers 110, channel layers 112 and stack sacrificial layers 116 may be formed into nanosheet stacks, by methods known in the art. The nanosheet stacks may have a length parallel to section line X-X and perpendicular to section lines Y1-Y1 and Y2-Y2. The nanosheet stacks may be formed by methods known in the arts, and include steps such as forming a hard mask (not shown) on the alternating layers, patterning the hard mask (not shown) and subsequent formation of one or more trenches (not shown), by removal of portions of each layer of the stacked nanosheet. The trench (not shown) may be formed between each nanosheet stack by an anisotropic etching technique, such as, for example, reactive ion etching (RIE), and stopping on etching a portion of the substrate 102 for subsequent formation of the STI 120 between each nanosheet stack. The hard mask (not shown) may be removed.

Each nanosheet stack may include a lower nanosheet stack covered by a stack sacrificial layer 116, covered by a sacrificial layer 110, covered by a stack sacrificial layer 116, covered by a sacrificial layer 110, covered by a stack sacrificial layer 116, covered by an upper nanosheet stack. The lower nanosheet stack may include a sacrificial layer 110, covered by a channel layer 112, covered by a sacrificial layer 110, covered by a channel layer 112, covered by a sacrificial layer 110. The upper nanosheet stack may include a sacrificial layer 110, covered by a channel layer 112, covered by a sacrificial layer 110, covered by a channel layer 112, covered by a sacrificial layer 110.

The material stacks that can be employed in embodiments of the present invention are not limited to the specific embodiment illustrated in FIGS. 2 and 3. In FIGS. 2 and 3, and only by way of an example, the lower nanosheet stack includes three layers of sacrificial layers 110 alternating with two layers of the channel layers 112, and the upper nanosheet stack includes three layers of sacrificial layers 110 alternating with two channel layers 112. The lower nanosheet stack may be separated from the upper nanosheet stack by the three layers of stack sacrificial layers 116, each separated by a sacrificial layer 110.

The lower nanosheet stack and the upper nanosheet stack each can include any number of sacrificial layers 110 and channel layers 112. There may be any number of stack sacrificial layers 116 each separated by a sacrificial layer 110. The nanosheet stack is used to produce a gate all around device that includes vertically stacked semiconductor channel material nanosheets for a pair of stacked p-FETs or a pair of stacked n-FETs, or a p-FET stacked on an n-FET or an n-FET stacked on a p-FET.

The formation of the trench, not shown, between each nanosheet stack may be formed by stopping on etching a portion of the substrate 102 for subsequent formation of the STI 130 between each nanosheet stack. The STI 130 may be patterned and formed selectively between nanosheet stacks in order to isolate one nanosheet stack from neighboring nanosheet stacks.

The STI 130 is formed in a portion of the trench (not shown). The STI 130 may be formed between adjacent nanosheet stacks in the portion of the trench (not shown), between adjacent nanosheet stacks. The STI 130 may be a dielectric material and may be formed using known deposition, planarization and etching techniques. A lower horizontal surface and a portion of a vertical side surface of the STI 130 may be adjacent to a lower horizontal surface and a vertical side surface of the substrate 102. The lower horizontal surface of the STI 130 may be below a lower horizontal surface of the lowermost sacrificial layer 110. An upper horizontal surface of the STI 130 may be at a same level or above an upper horizontal surface of the lowermost sacrificial layer 110.

The sacrificial gate 126 and the gate cap 128 are formed orthogonal (perpendicular) to the nanosheet stacks. By way of illustration, two sacrificial gates 126 and two gate caps 128 are depicted in the drawings of the present application. The sacrificial gate 126 may include a single sacrificial material or a stack of two or more sacrificial materials. The at least one sacrificial material can be formed by forming a blanket layer (or layers) of a material (or various materials) and then patterning the material (or various materials) by lithography and an etch. The sacrificial gate 126 can include any material including, for example, polysilicon, amorphous silicon, or multilayered combinations thereof. The sacrificial gate 126 can be formed using any deposition technique including, for example, chemical vapor deposition (CVD), physical vapor deposition (PVD), high density plasma (HDP) deposition, and spin on techniques. Optionally, a gate dielectric layer and the gate cap 128 may be formed as part of the sacrificial gate 126 in accordance with known techniques.

In an embodiment, the sacrificial gate 126 is deposited with a thickness sufficient to fill, or substantially fill, the spaces between adjacent nanosheet structures and cover a horizontal upper surface of the STI 130. The sacrificial gate 126 may be adjacent to vertical side surfaces of the nanosheet stack, including the lower nanosheet stack, the upper nanosheet stack and the three layers of stack sacrificial layers 116 each separated by a sacrificial layer 110. The sacrificial gate 126 may cover an upper horizontal surface of an uppermost sacrificial layer 110 of the nanosheet stack. A height of the sacrificial gate 126 may be much thicker than the underlying structure and may have a height between 100 nm and 150 nm about the nanosheet stack. The gate cap 128 may cover an upper horizontal surface and a vertical side surface of the sacrificial gate 126. The gate cap 128 may cover a portion of the upper horizontal surface of the uppermost sacrificial layer 110 of the nanosheet stack.

A source drain trench 132 may be formed along the nanosheet stack. The source drain trench 132 may be formed by an anisotropic etching technique, such as, for example, reactive ion etching (RIE). A lowermost surface of the source drain trench (not shown) may be below the lower surface of the lowermost sacrificial layer 110. The anisotropic etching may remove aligned vertical portions of the stacked nanosheet stack between adjacent sacrificial gates 126 and gate caps 128. The sacrificial gate 126 and the gate cap 128 may protect remaining portions of the nanosheet stack. The vertical portion of the nanosheet stack may be recessed for subsequent formation of a source drain epitaxy in the source drain trench 132.

As shown in FIGS. 2 and 3, between the lower nanosheet stack and the upper nanosheet stack are three stack sacrificial layers 116 with a sacrificial layer 110 between each. The three stack sacrificial layers 116 with sacrificial layer 110 will help to form inner spacers between the upper and lower nanosheet stacks which allows for later formation of source and drain without direct connection to gate, for each of the upper and lower nanosheet stacks.

Figure 5B:
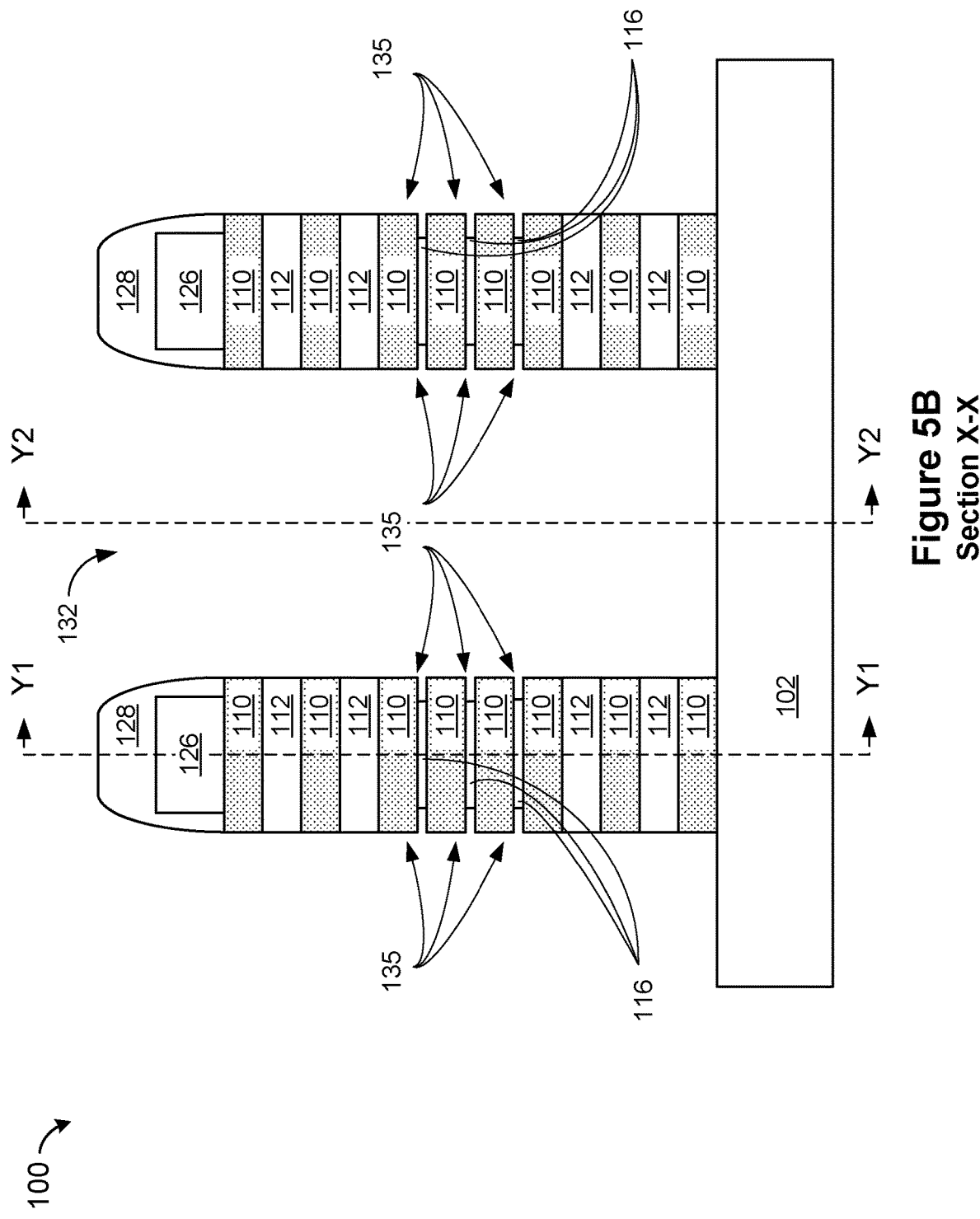
FIG. 5B illustrates a cross-sectional view of the semiconductor structure along section line X-X, according to an alternate embodiment.
Figure 6:
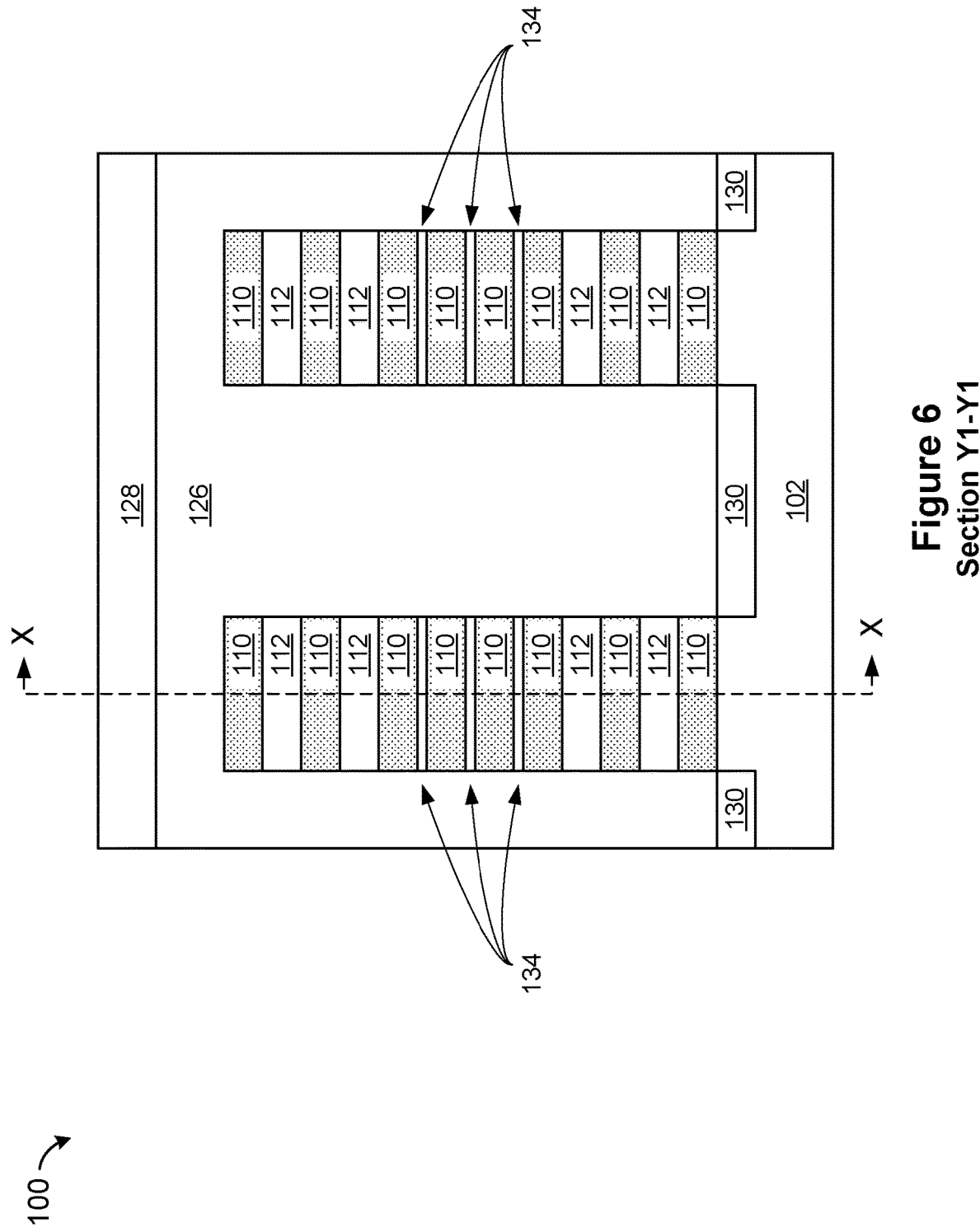
FIG. 6 illustrates a cross-sectional view of the semiconductor structure along section line Y1-Y1, according to an embodiment.

Referring now to FIGS. 5A, 5B and 6 the structure 100 is shown according to an exemplary embodiment. FIGS. 5A, 5B and 6 are each a cross-sectional view of the structure 100 along section lines X-X, X-X and Y1-Y1, respectively. FIG. 5A and FIG. 5B are each perpendicular to FIG. 6. The illustration of FIG. 4 of section line Y2-Y2 remains unchanged. FIG. 5B is an alternate embodiment of FIG. 5A.

As shown in FIG. 5A, the stack sacrificial layers 116 may be selectively removed using one or more known techniques, forming openings 134. The stack sacrificial layers 116 are removed selective to the channel layers 112, the sacrificial layers 110, the STI 130, the sacrificial gate 126, the cap 128 and the substrate 102. For example, a dry etching technique can be used to selectively remove the stack sacrificial layers 116, such as, for example, using vapor phased HCl dry etch.

As shown in FIG. 5B in the alternate embodiment, the stack sacrificial layers 116 may be recessed using one or more known techniques, forming openings 135. The stack sacrificial layers 116 are recessed selective to the channel layers 112, the sacrificial layers 110, the STI 130, the sacrificial gate 126, the cap 128 and the substrate 102. For example, a dry etching technique can be used to selectively recess the stack sacrificial layers 116, such as, for example, using vapor phased HCl dry etch.

Figure 7A:
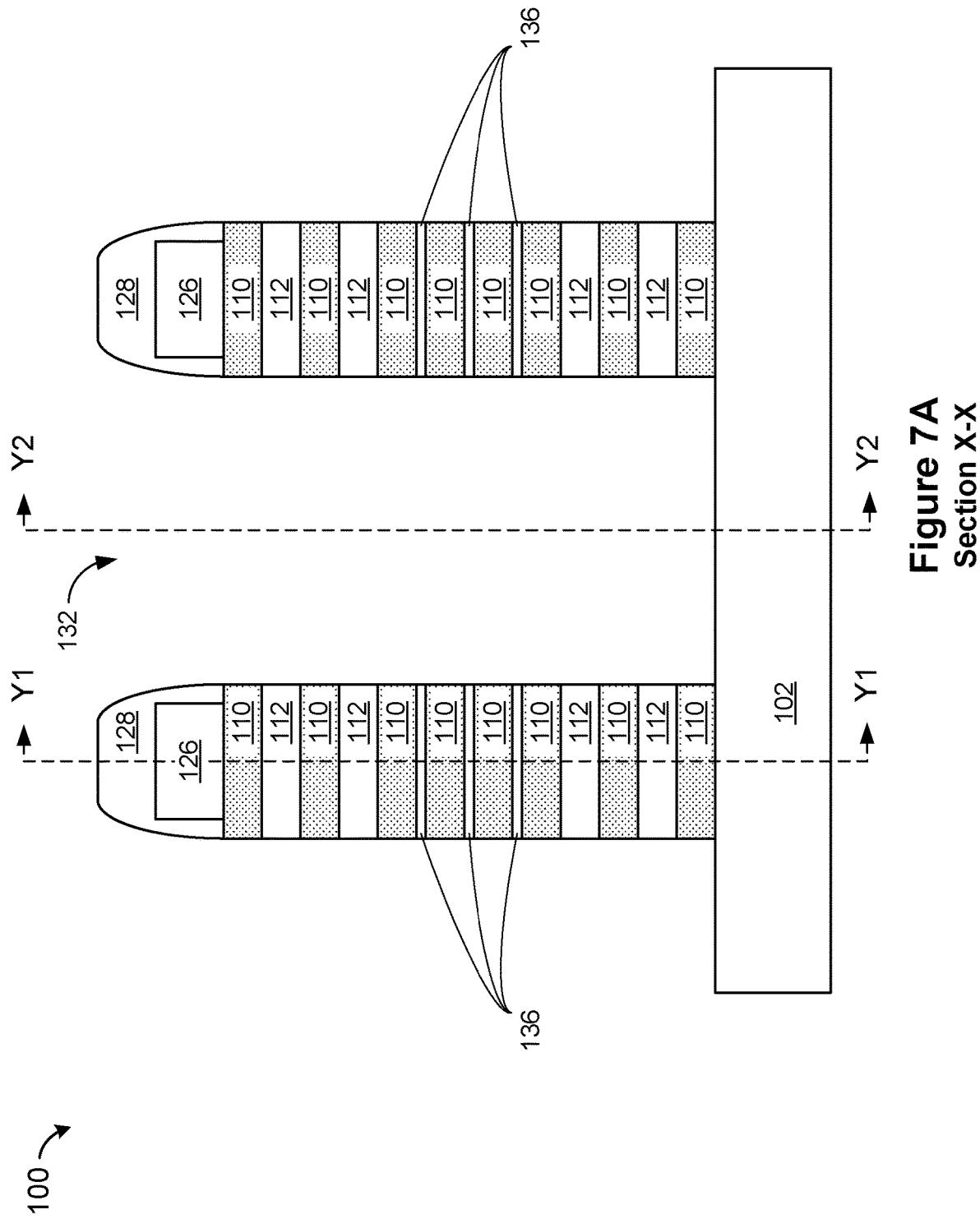
FIG. 7A illustrates a cross-sectional view of the semiconductor structure along section line X-X, and illustrates formation of a thin insulator layer, according to an embodiment.
Figure 7B:
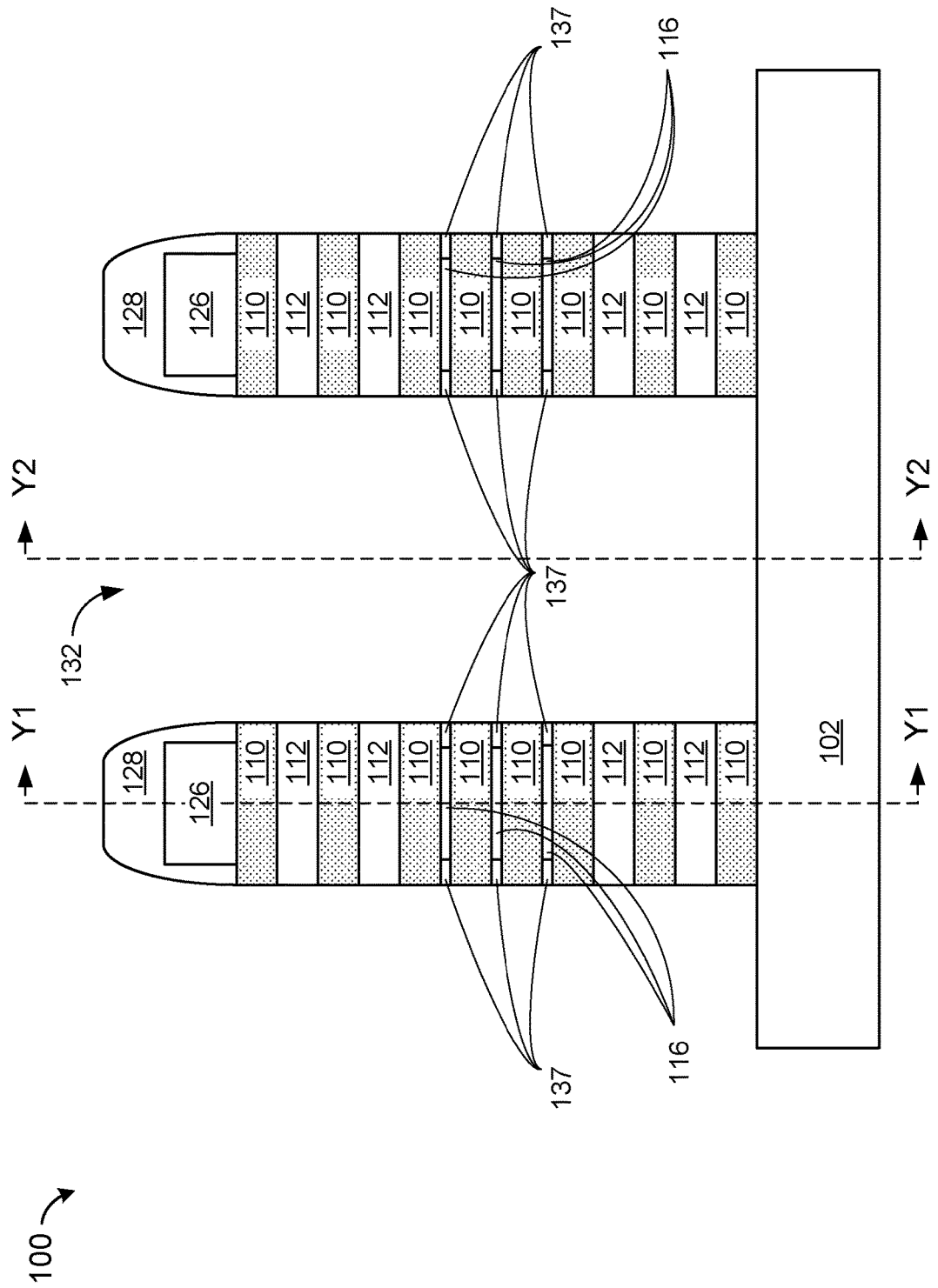
FIG. 7B illustrates a cross-sectional view of the semiconductor structure along section line X-X, according to an alternate embodiment.
Figure 8:
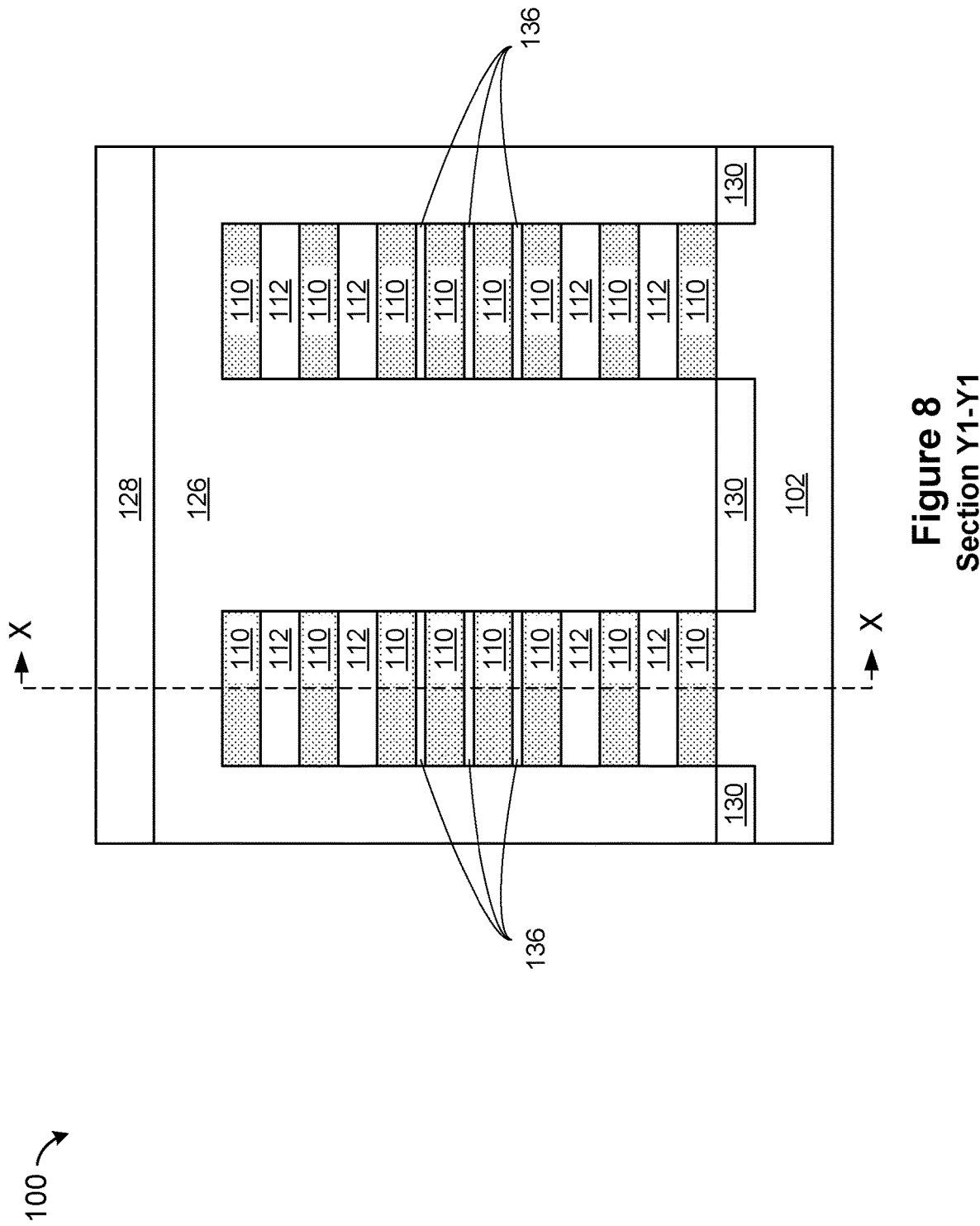
FIG. 8 illustrates a cross-sectional view of the semiconductor structure along section line Y1-Y1, according to an embodiment.

Referring now to FIGS. 7A, 7B and 8 the structure 100 is shown according to an exemplary embodiment. FIGS. 7A, 7B and 8 are each a cross-sectional view of the structure 100 along section lines X-X, X-X and Y1-Y1, respectively. FIGS. 7A and 7B are each perpendicular to FIG. 8. The illustration of FIG. 4 of section line Y2-Y2 remains unchanged. FIG. 7B is an alternate embodiment of FIG. 7A.

As shown in FIGS. 7A and 8, a thin insulator layer 136 may be formed in the openings 134. The thin insulator layer 136 may be formed where the stack sacrificial layer 116 has been removed. The thin insulator layer 136 may be formed between the lower nanosheet stack, and formed between the sacrificial layers 110 between the lower nanosheet stack and the upper nanosheet stack, and formed below the upper nanosheet stack.

The thin insulator layer 136 may be formed after several processes, including for example, conformally depositing or growing a dielectric and performing an isotropic etch back process. The thin insulator layer 136 may include any dielectric material such as silicon nitride (SiN), silicon boron carbon nitride (SiBCN), silicon oxide carbon nitride (SiOCN), aluminum oxide (AlOx), and may include a single layer or may include multiple layers of dielectric material. The thin insulator layer 136 may have a thickness ranging from about 3 nm to about 15 nm.

As shown in FIGS. 7A and 8, between the lower nanosheet stack and the upper nanosheet stack there are three thin insulators layers 136 with a sacrificial layer 110 between each. The three thin insulators layers 136 with sacrificial layers 110 will help to form an inner spacer between the upper and lower nanosheet stacks which allows for later formation of source and drain without direct connection to a subsequently formed gate, for each of the upper and lower nanosheet stacks As shown in FIG. 7B, a thin insulator layer 137 may be formed in the openings 135. The FIG. 8 remains as illustrated for the alternate embodiment. The thin insulator layer 137 may be formed where the stack sacrificial layer 116 has been recessed. The thin insulator layer 137 may be formed between the lower nanosheet stack, formed between the sacrificial layers 110 between the lower nanosheet stack and the upper nanosheet stack, and formed below the upper nanosheet stack.

The thin insulator layer 137 may be formed after several processes, including for example, conformally depositing or growing a dielectric and performing an isotropic etch back process. The thin insulator layer 137 may include any dielectric material such as silicon nitride (SiN), silicon boron carbon nitride (SiBCN), silicon oxide carbon nitride (SiOCN), aluminum oxide (AlOx), and may include a single layer or may include multiple layers of dielectric material. The thin insulator layer 137 may have a thickness ranging from about 3 nm to about 15 nm.

As shown in FIG. 7B, between the lower nanosheet stack and the upper nanosheet stack there are three layers of the stack sacrificial layer 116 surrounded by the thin insulator layer 137 with a sacrificial layer 110 between each. The are three layers of the stack sacrificial layer 116 surrounded by the thin insulator layer 137 with a sacrificial layer 110 will help to form an inner spacer between the upper and lower nanosheet stacks which allows for later formation of source and drain without direct connection to a subsequently formed gate, for each of the upper and lower nanosheet stacks Referring now to FIG. 9A the structure 100 is shown according to an exemplary embodiment. FIG. 9A is a cross-sectional view of the structure 100 along section lines X-X. The illustration of FIG. 4 of section line Y2-Y2 remains unchanged.

Portions of the sacrificial layers 110 may be selectively removed using known techniques. For example, a wet or dry etch process can be used with the appropriate chemistry to remove portions of each of the sacrificial layers 110. The material used for the etching process may be selective such that the channel layers 112, the thin insulator layer 136, the sacrificial gate 126, the gate cap 128, the STI 130 and the substrate 102 remain and are not etched. After etching, portions of the sacrificial layers 110 covered on opposite sides by the sacrificial gate 126 may remain as part of the nanosheet stack. In such cases, the sacrificial gate 126 supports the remaining channel layers 112 and the remaining thin insulator layers 136 of the nanosheet stack.

As shown in FIG. 9A, between the lower nanosheet stack and the upper nanosheet stack there are three thin insulators layers 136 with a sacrificial layer 110 between each. The three thin insulators layers 136 with sacrificial layers 110 provides a structure which prevents the sacrificial layers between the upper and lower nanosheet stacks from having too much of the portions of sacrificial layers 110 removed during this process step. For example, if the sacrificial layer 110 between the upper and lower nanosheets had a thicker vertical thickness than the other sacrificial layers 110, more material might have been removed from sides of the sacrificial layer.

Figure 9B:
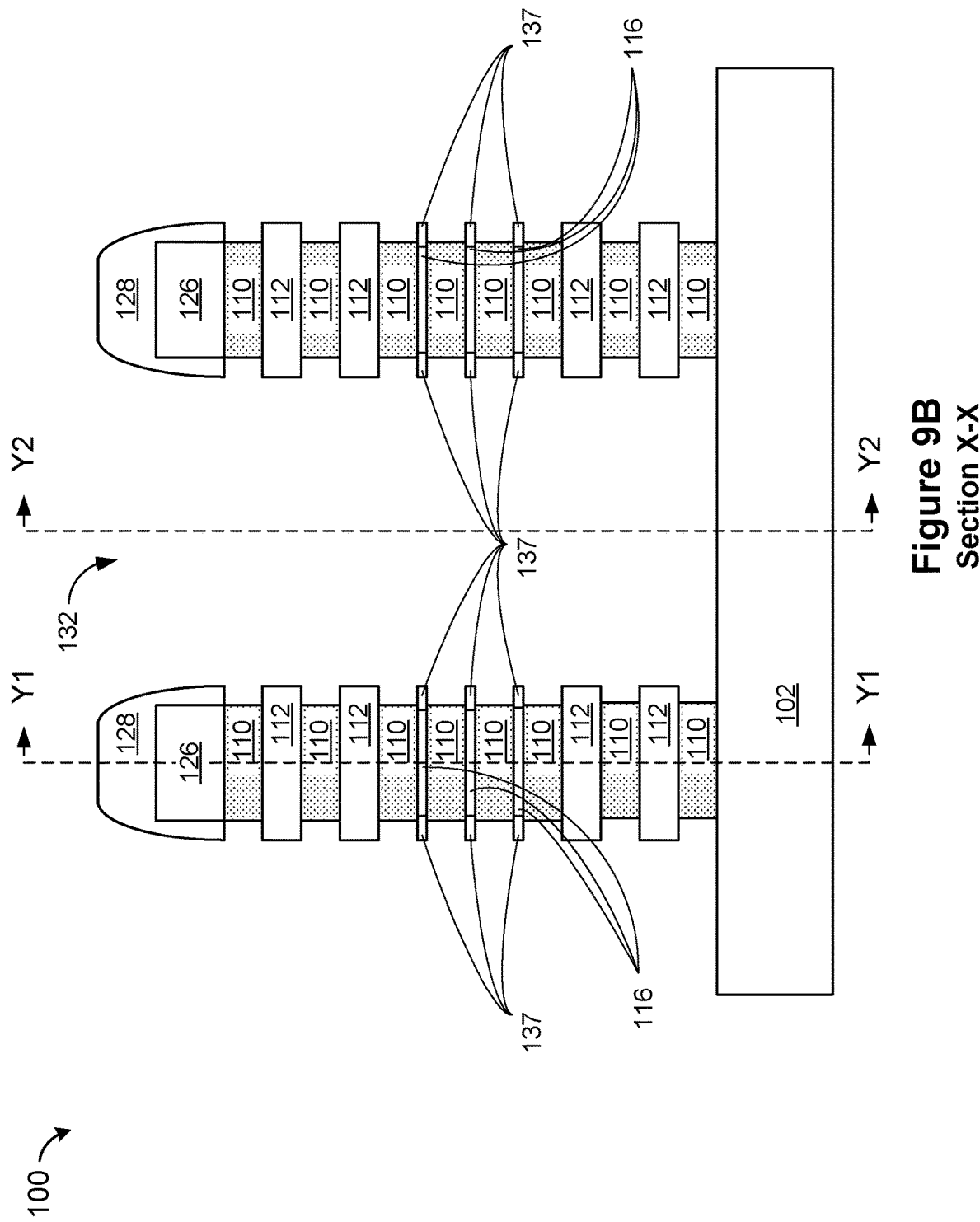
FIG. 9B illustrates a cross-sectional view of the semiconductor structure along section line X-X, according to an alternate embodiment.

Referring now to FIG. 9B the structure 100 is shown according to an alternate embodiment. FIG. 9B is a cross-sectional view of the structure 100 along section lines X-X. The illustration of FIG. 8 of section line Y1-Y1 remains unchanged. The illustration of FIG. 4 of section line Y2-Y2 remains unchanged.

Portions of the sacrificial layers 110 may be selectively removed using known techniques. For example, a wet or dry etch process can be used with the appropriate chemistry to remove portions of each of the sacrificial layers 110. The material used for the etching process may be selective such that the channel layers 112, the thin insulator layer 137, the stack sacrificial layer 116, the sacrificial gate 126, the gate cap 128, the STI 130 and the substrate 102 remain and are not etched. After etching, portions of the sacrificial layers 110 covered on opposite sides by the sacrificial gate 126 may remain as part of the nanosheet stack. In such cases, the sacrificial gate 126 supports the remaining channel layers 112 and the remaining thin insulator layers 137 surrounding the stack sacrificial layers 116 of the nanosheet stack.

As shown in FIG. 9B, between the lower nanosheet stack and the upper nanosheet stack there are three thin insulators layers 137 each surrounding a stack sacrificial layer 116 with a sacrificial layer 110 between each. The three thin insulators layers 137 each surrounding a stack sacrificial layer 116 with sacrificial layers 110 provides a structure which prevents the sacrificial layers between the upper and lower nanosheet stacks from having too much of the portions of sacrificial layers 110 removed during this process step. For example, if the sacrificial layer 110 between the upper and lower nanosheets had a thicker vertical thickness than the other sacrificial layers 110, more material might have been removed from sides of the sacrificial layer.

Figure 10:
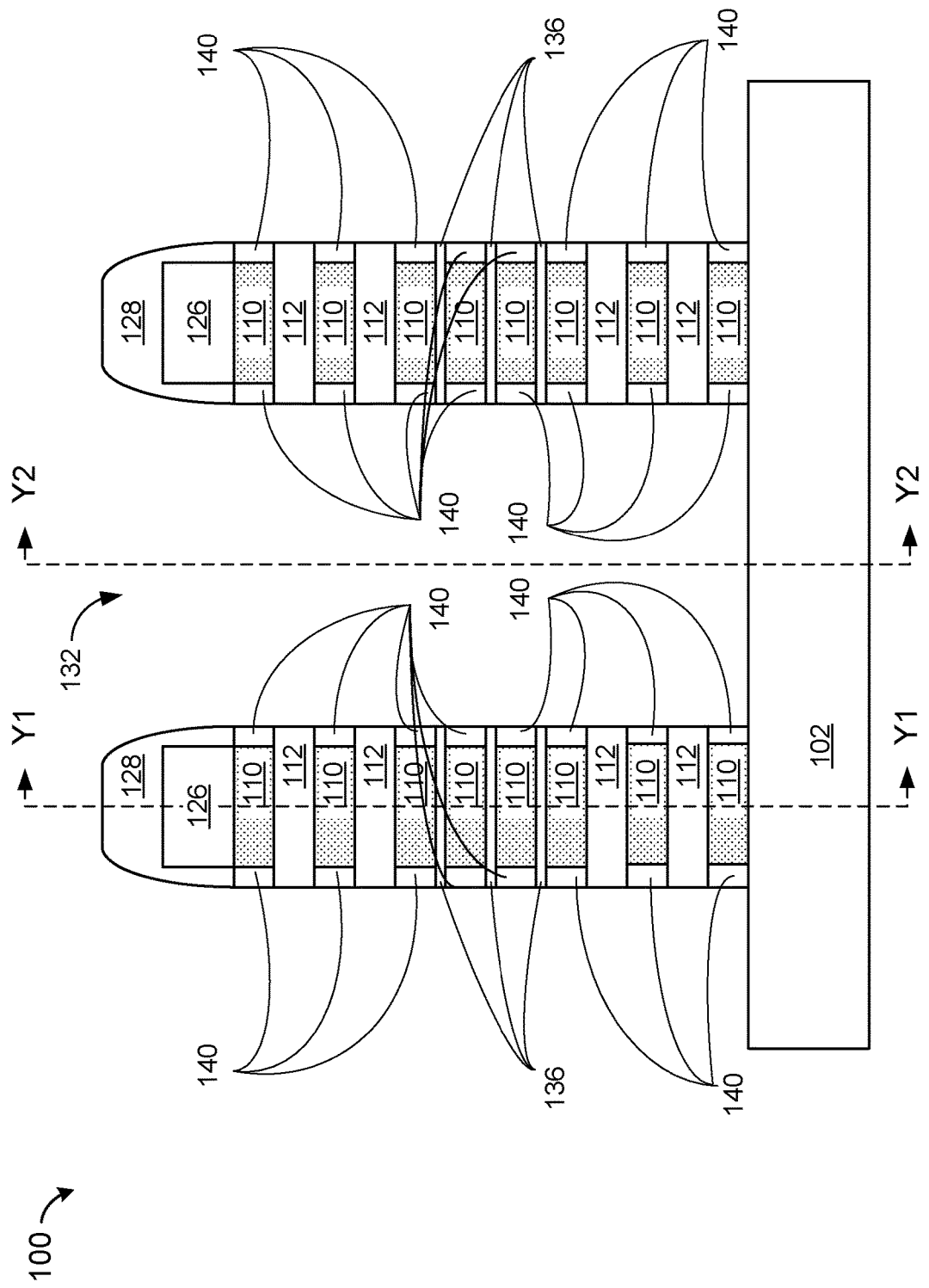
FIG. 10 illustrates a cross-sectional view of the semiconductor structure along section line X-X, and illustrates formation of inner spacers, according to an embodiment.

Referring now to FIG. 10 the structure 100 is shown according to an exemplary embodiment. FIG. 10 is a cross-sectional view of the structure 100 along section lines X-X. The illustration of FIG. 8 of section line Y1-Y1 remains unchanged. The illustration of FIG. 4 of section line Y2-Y2 remains unchanged. An inner spacer 140 may be formed.

The inner spacer 140 may be formed by conformally depositing or growing a dielectric material, followed by a combination of dry and wet isotropic etch back steps. The inner spacer 140 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an isotropic etch back process such as a reactive ion etch (RIE) and/or wet etch process, or any suitable etch process. In an embodiment, the inner spacer 140 may include one or more layers. In an embodiment, the inner spacer 140 may include any dielectric material such as silicon oxide, silicon oxynitride, silicon nitride, SiBCN, SiOC, low-k dielectric or any combination of these materials. In an embodiment, the inner spacer 140 may be nitride. In an alternate embodiment, the inner spacer 140 may be oxide.

The inner spacer 140 may completely fill in spaces between the channel layers 112, between the upper most channel layer 112 and the sacrificial gate 126 and the gate cap 128, and between the lowermost channel layer 112 and the substrate 102, where the portions of the sacrificial layers 110 had been previously removed.

A vertical side surface of the inner spacer may be aligned with a vertical side surface of the channel layers 112 and a vertical side surface of the gate cap 128.

As shown in FIG. 10, between the lower nanosheet stack and the upper nanosheet stack there are three thin insulators layers 136 with a sacrificial layer 110 between each. The three thin insulators layers 136 with sacrificial layers 110 provides a structure which helps formation of the inner spacer 140 during this processing step. Specifically, when excess material of the inner spacer 140 is removed, if the sacrificial layer 110 between the upper and lower nanosheets had a thicker vertical thickness than the other sacrificial layers 110, too much of the inner spacer 140 would be removed surrounding the sacrificial layer 110 between the upper and lower nanosheet stack. Potentially all of the inner spacer 140 would be removed surrounding the sacrificial layer 110 between the upper and lower nanosheet stack.

Figure 11:
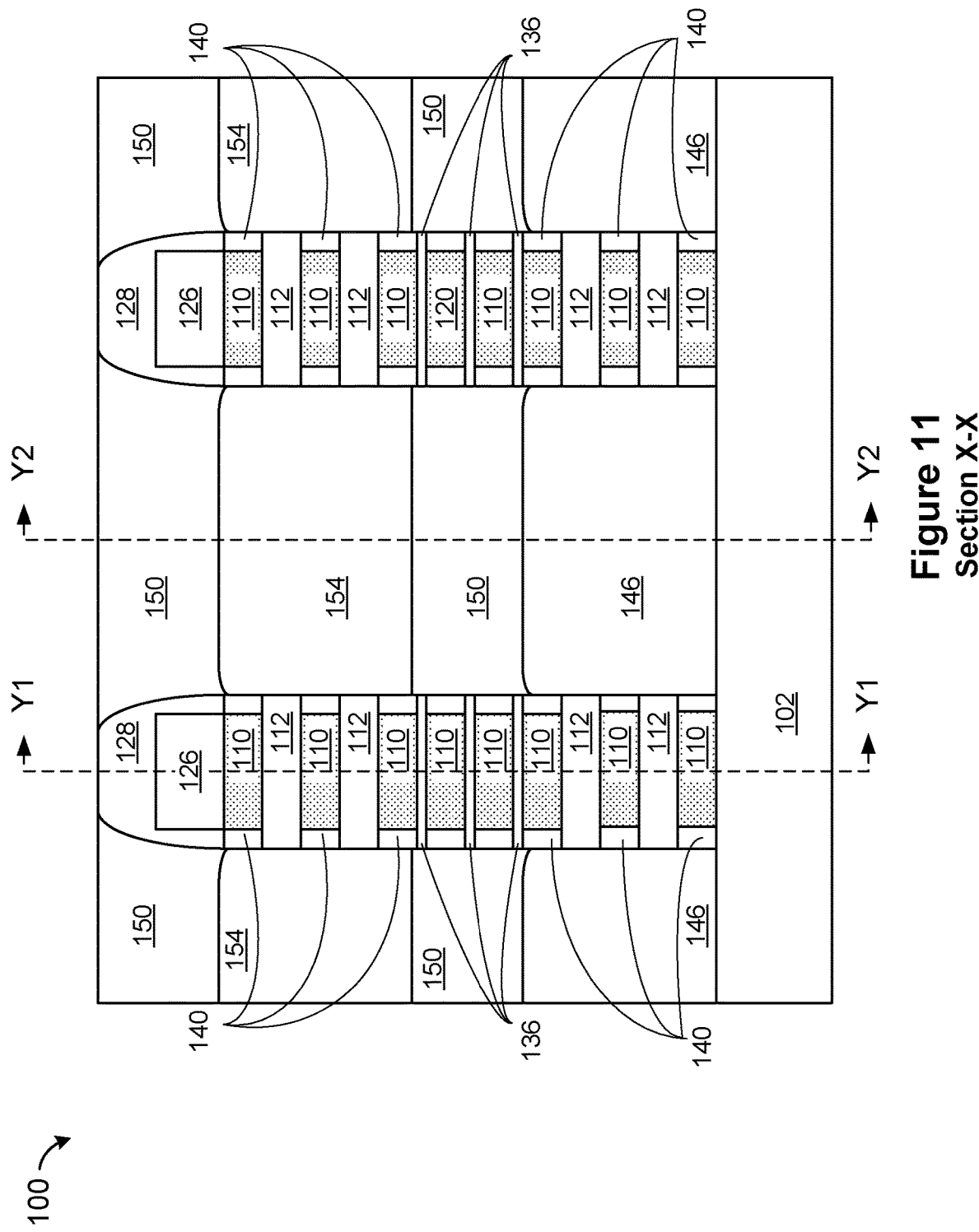
FIGS. 11 and 12 each illustrate a cross-sectional view of the semiconductor structure along section lines X-X and Y2-Y2, respectively, and illustrate formation of source drain regions, an interlayer dielectric and a dielectric, according to an embodiment.
Figure 12:
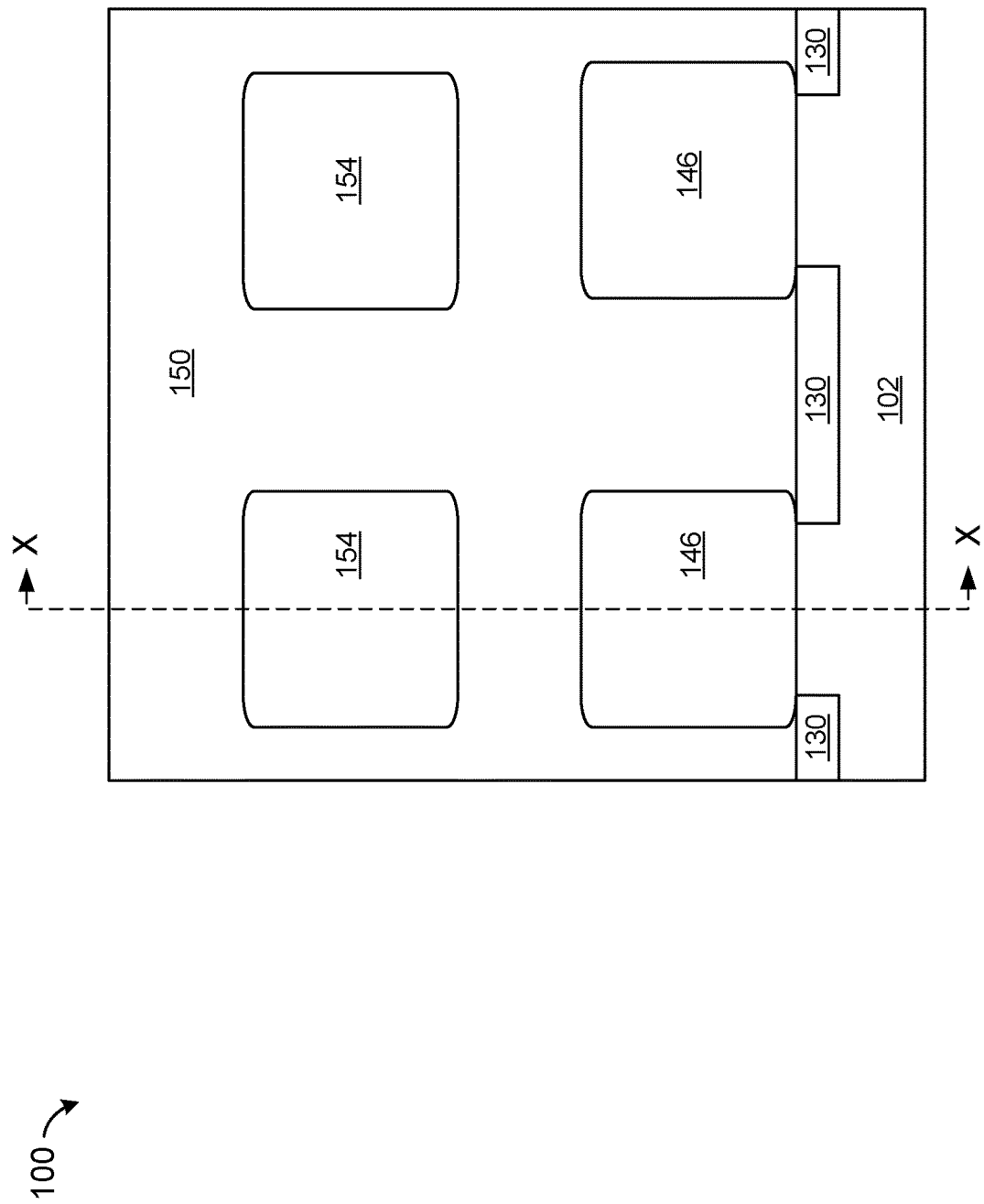

Referring now to FIGS. 11 and 12 the structure 100 is shown according to an exemplary embodiment. FIGS. 11 and 12 are each a cross-sectional view of the structure 100 along section lines X-X and Y2-Y2, respectively. FIG. 11 is perpendicular to FIG. 12. The illustration of FIG. 8 of section line Y1-Y1 remains unchanged. A lower source drain 146, an interlayer dielectric (hereinafter "ILD") 150, an upper source drain 154 may be formed.

The lower source drain 146 may be epitaxially grown surrounding a vertical portion of the lower stack on opposite sides of the sacrificial gate 126. In this embodiment, the lower source drain 146 may surround the lower most two channel layers 112 and the lower most three sacrificial layers 110 with surrounding inner spacers 140 of the lower stack. The lower source drain 146 may be adjacent to an exposed upper surface of the substrate 102 and a portion of an exposed upper surface of the STI 130.

The ILD 150 may be formed by conformally depositing or growing a dielectric material, followed by a combination of dry and wet anisotropic etch and recessing steps. The ILD 150 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the ILD 150 may include one or more layers. In an embodiment, the ILD 150 may include any dielectric material such as silicon oxide, silicon oxynitride, silicon nitride, SiBCN, SiOC, low-k dielectric or any combination of these materials. In an embodiment, the ILD 150 may be a nitride. In an alternate embodiment, the ILD 150 may be an oxide. The ILD 150 may surround the thin insulator layers 136 and the surrounding sacrificial layers 110 with surrounding inner spacers 140. A portion of the ILD 150 may surround and separate adjacent lower source drains 146, as shown in FIG. 12. A portion of the ILD 150 may be coplanar with an upper horizontal surface and a vertical surface of the lower source drain 146. The ILD 150 may be adjacent to a remaining portion of an exposed upper surface of the STI 130.

The upper source drain 154 may be epitaxially grown surrounding a vertical portion of the upper stack on opposite sides of the sacrificial gate 126. In this embodiment, the upper source drain 154 may surround the upper most two channel layers 112 and the upper most three sacrificial layers 110 with surrounding inner spacers 140 of the upper stack. The upper source drain 154 may be adjacent to an exposed upper surface of the ILD 150. An upper surface of the upper source drain 154 may be coplanar with an upper surface of the uppermost sacrificial layer 110 with surrounding inner spacers 140.

Additional portions of the ILD 150 may be formed which surround and separate adjacent upper source drains 154, as shown in FIG. 12. Additional portions of the ILD 150 may be formed above the upper source drain 154. The ILD 150 may surround the sacrificial gate 126 and surrounding gate cap 128. A vertical surface of the ILD 150 may be coplanar with a vertical surface of the gate cap 128. The ILD 150 may physically and electrically isolate the lower source drain 146 and the upper source drain 154, and adjacent nanosheet stacks.

Figure 13:
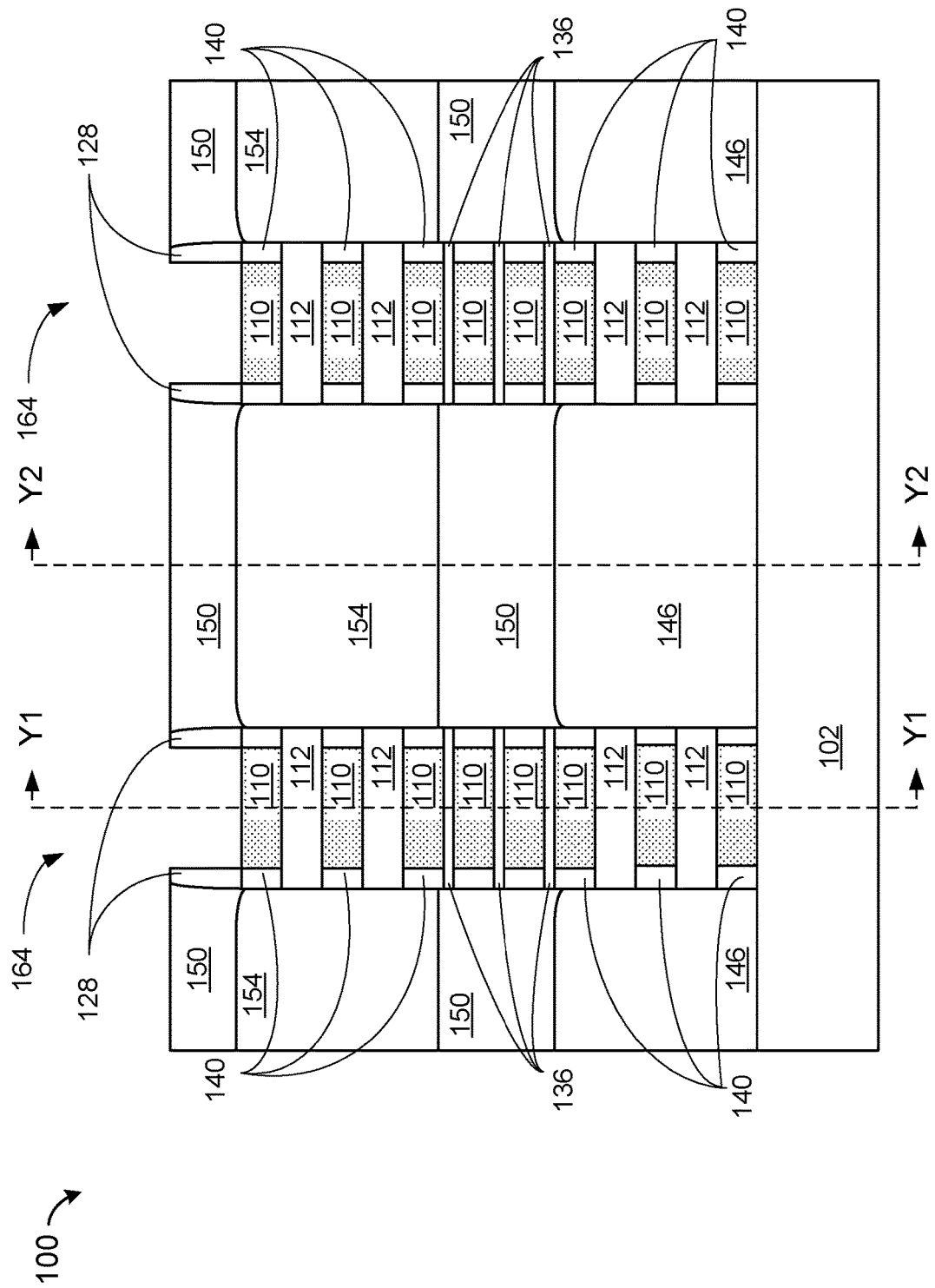
FIGS. 13, 14 and 15 each illustrate a cross-sectional view of the semiconductor structure along section lines X-X, Y1-Y1 and Y2-2, respectively, and illustrate removal of a sacrificial gate, according to an embodiment.
Figure 14:
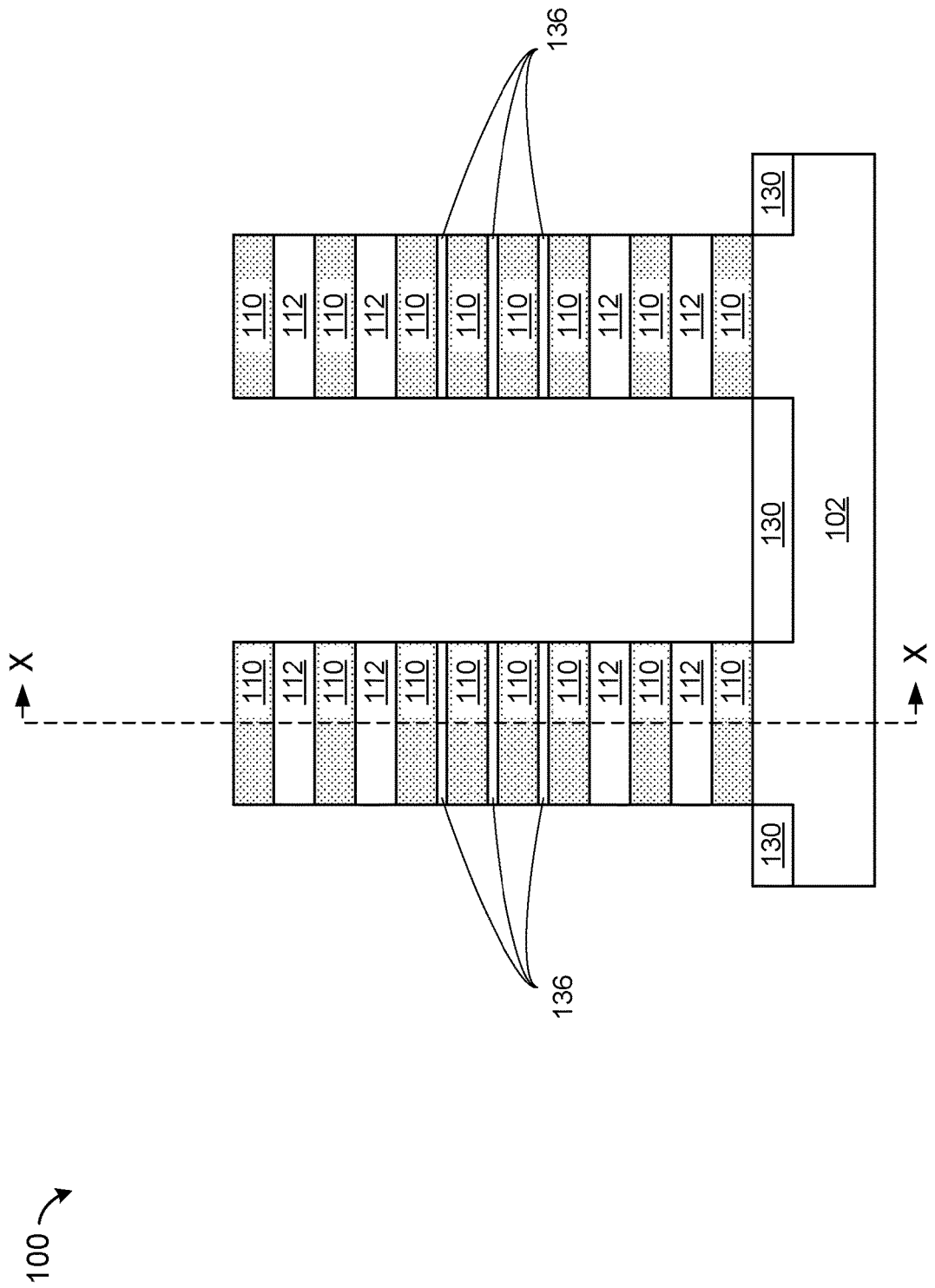
Figure 15:
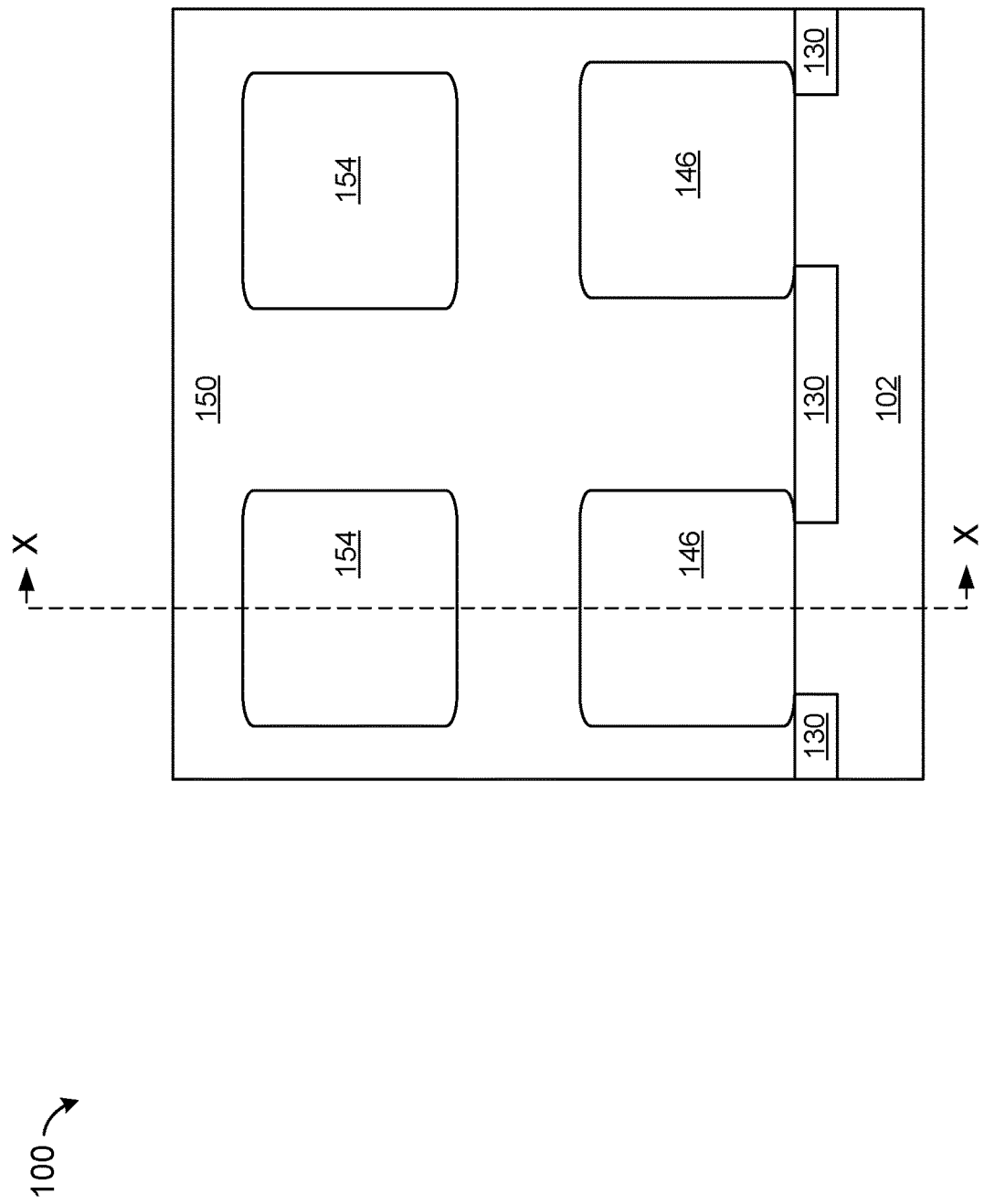

Referring now to FIGS. 13, 14 and 15 the structure 100 is shown according to an exemplary embodiment. FIGS. 13, 14 and 15 are each a cross-sectional view of the structure 100 along section lines X-X, Y1-Y1 and Y2-Y2, respectively. FIGS. 14 and 15 are parallel to each other, and FIG. 13 is perpendicular to FIGS. 14 and 15. A portion of the gate cap 128 and the sacrificial gate 126 may be removed.

A chemical mechanical polishing (CMP) technique may be used to remove excess material and polish upper surfaces of the structure 100, exposing an upper surface of the sacrificial gate 126. The sacrificial gate 126 may be removed by methods known in the arts. An upper surface of the uppermost sacrificial layer 110 may be exposed. A remaining portion of the gate cap 128 may remain above the nanosheet stack, covering outside an uppermost pair of inner spacers 140 surrounding the uppermost sacrificial layer 110.

Figure 16A:
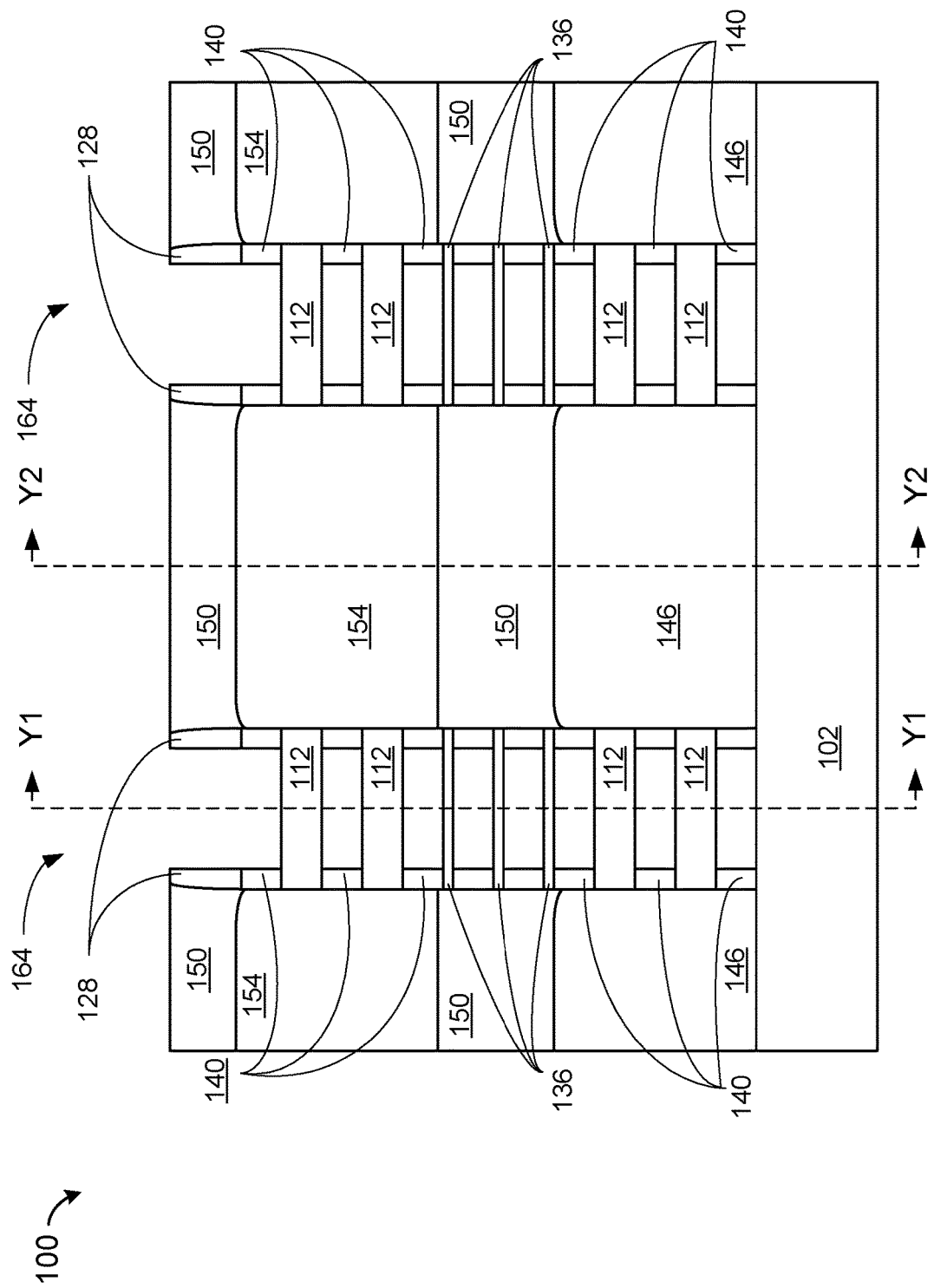
FIG. 16A illustrates a cross-sectional view of the semiconductor structure along section line X-X, and illustrates removal of sacrificial semiconductor layers, according to an embodiment.
Figure 16B:
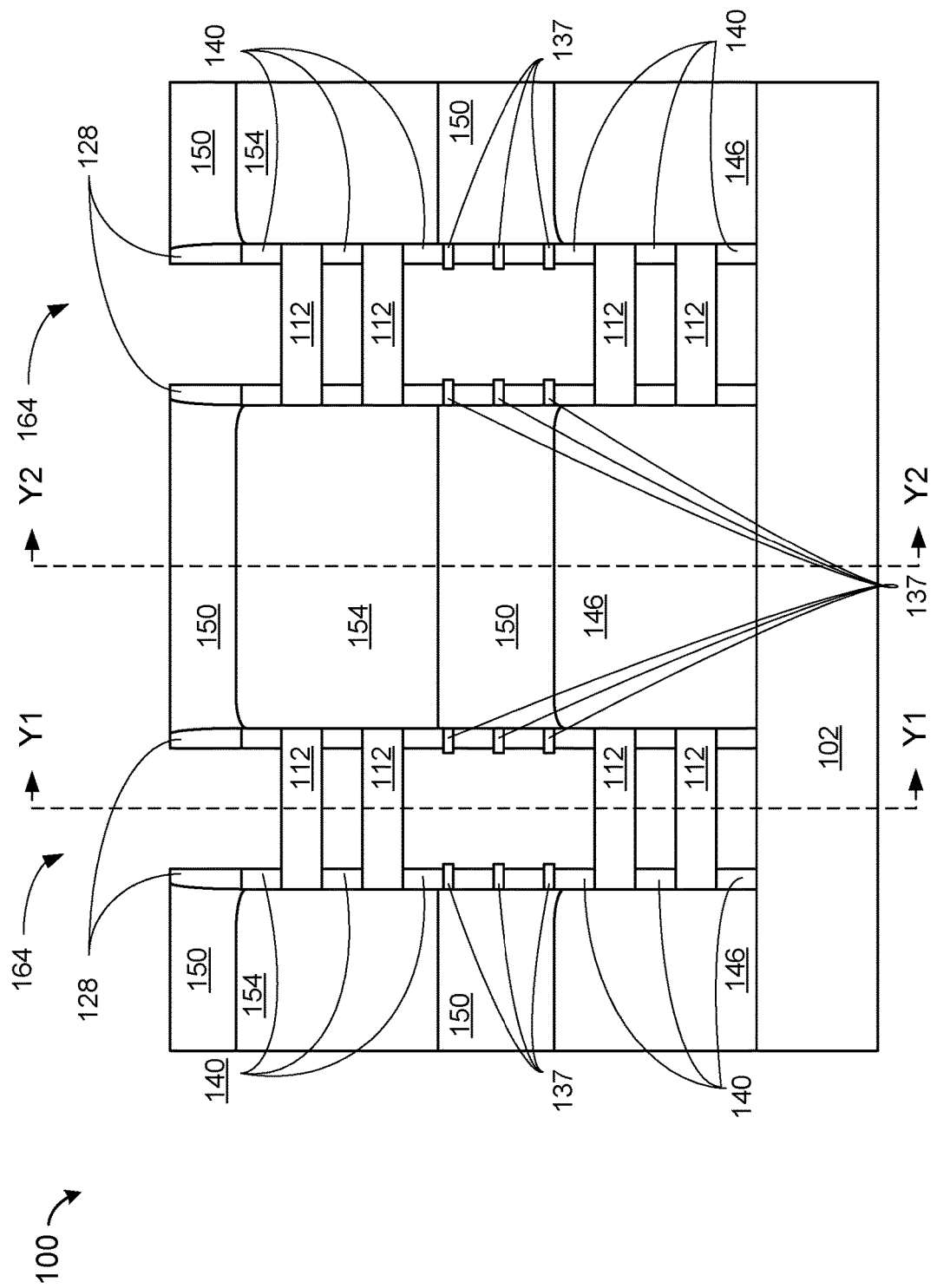
FIG. 16B illustrates a cross-sectional view of the semiconductor structure along section line X-X, according to an alternate embodiment.
Figure 17A:
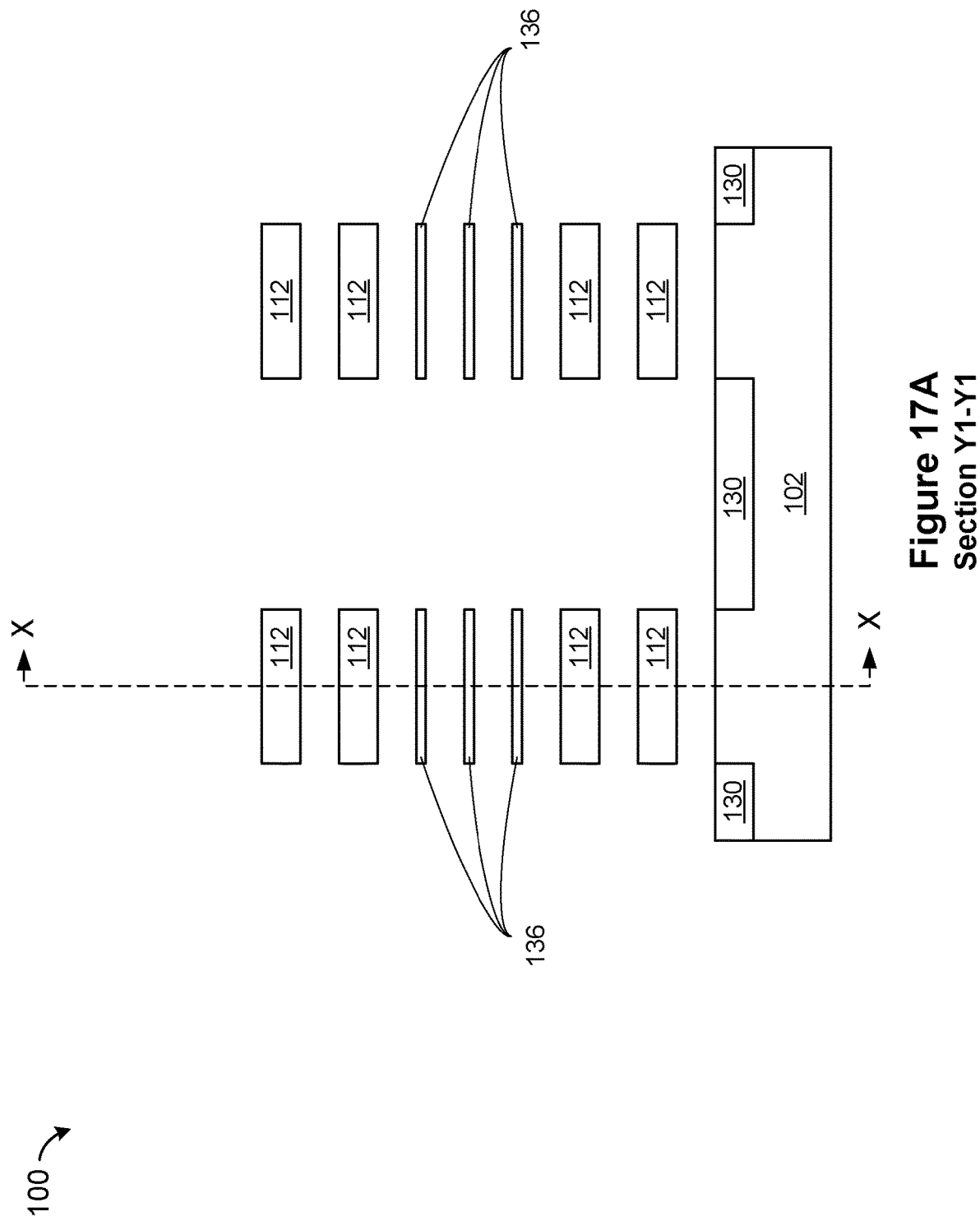
FIG. 17A illustrates a cross-sectional view of the semiconductor structure along section line Y1-Y1, according to an embodiment.

Referring now to FIGS. 16A, 16B, 17A and 17B the structure 100 is shown according to an exemplary embodiment. FIGS. 16A, 16B, 17A and 17B are each a cross-sectional view of the structure 100 along section lines X-X, X-X, Y1-Y1 and Y1-Y1, respectively. FIGS. 16A and 16B are each perpendicular to FIGS. 17A and 17B. The illustration of FIG. 15 of section line Y2-Y2 remains unchanged. FIGS. 16B and 17B are an alternate embodiment.

As shown in FIGS. 16A and 17A, the sacrificial layers 110 may be removed. The sacrificial layers 110 are removed selective to the channel layers 112, the inner spacers 140, the ILD 150, the thin insulator layer 136, the upper source drain 154, the lower source drain 146, the STI 130 and the substrate 102. As illustrated in FIG. 17A, the remaining channel layers 112 and the thin insulator layer 136 are shown suspended and are supported on both ends by the upper source drain 154 and the lower source drain 146 which are not shown. For example, a dry etch process can be used to selectively remove the sacrificial layers 110, such as using vapor phased HCl dry etch.

As shown in FIGS. 16B and 17B, the sacrificial layers 110 and the remaining portions of the stack sacrificial layers 116 may be removed. The sacrificial layers 110 and the stack sacrificial layers 116 are removed selective to the channel layers 112, the inner spacers 140, the ILD 150, the thin insulator layer 137, the upper source drain 154, the lower source drain 146, the STI 130 and the substrate 102. As illustrated in FIG. 17B, the remaining channel layers 112 are shown suspended and are supported on both ends by the upper source drain 154 and the lower source drain 146 which are not shown. For example, a dry etch process can be used to selectively remove the sacrificial layers 110, such as using vapor phased HCl dry etch. The thin insulator 137 may be wider than the inner spacer 140 any may extend into the space where the sacrificial layers 110 were removed.

Figure 18A:
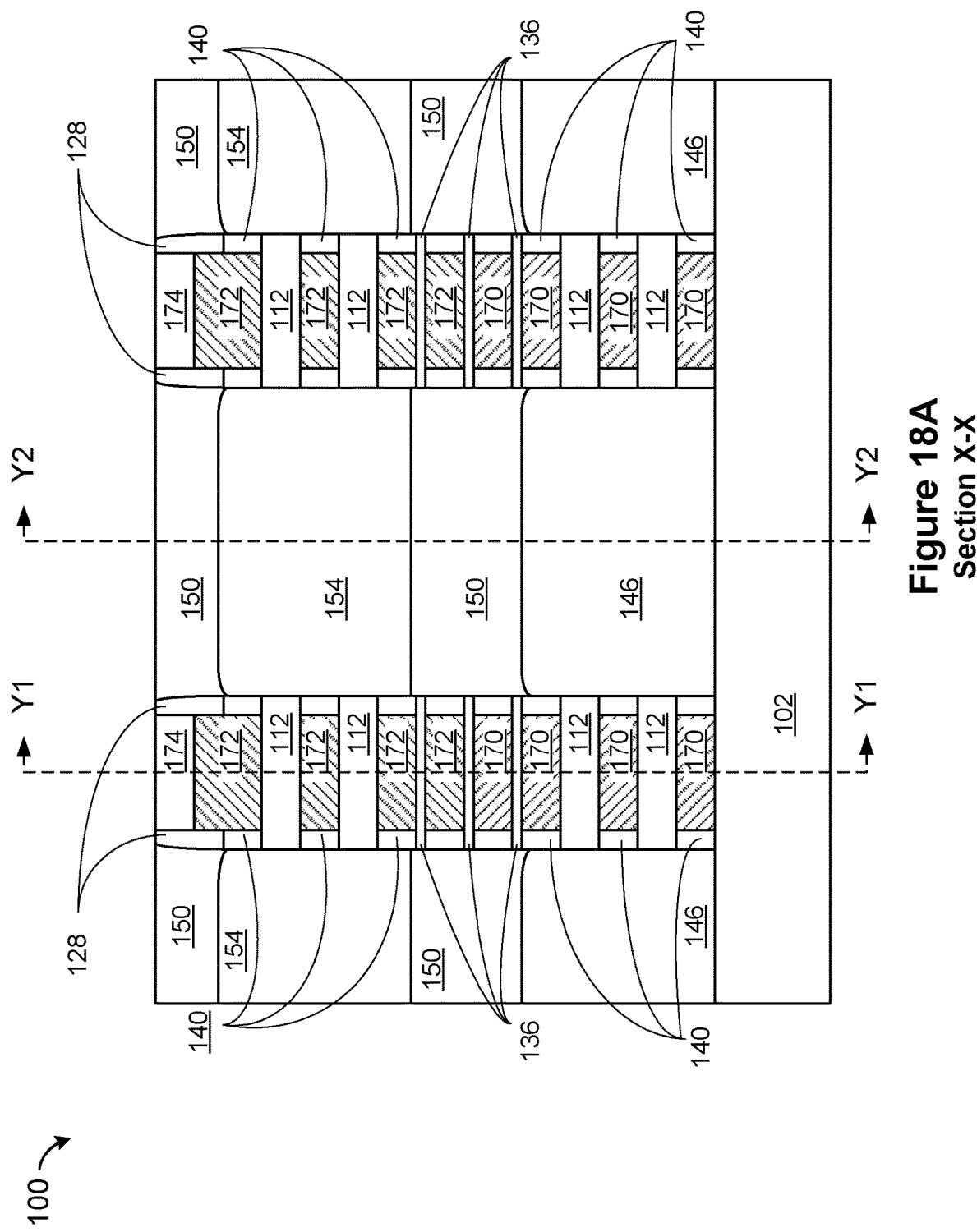
FIG. 18A illustrates a cross-sectional view of the semiconductor structure along section line X-X, and illustrates formation of a first work function metal and a second work function metal, according to an embodiment.
Figure 18B:
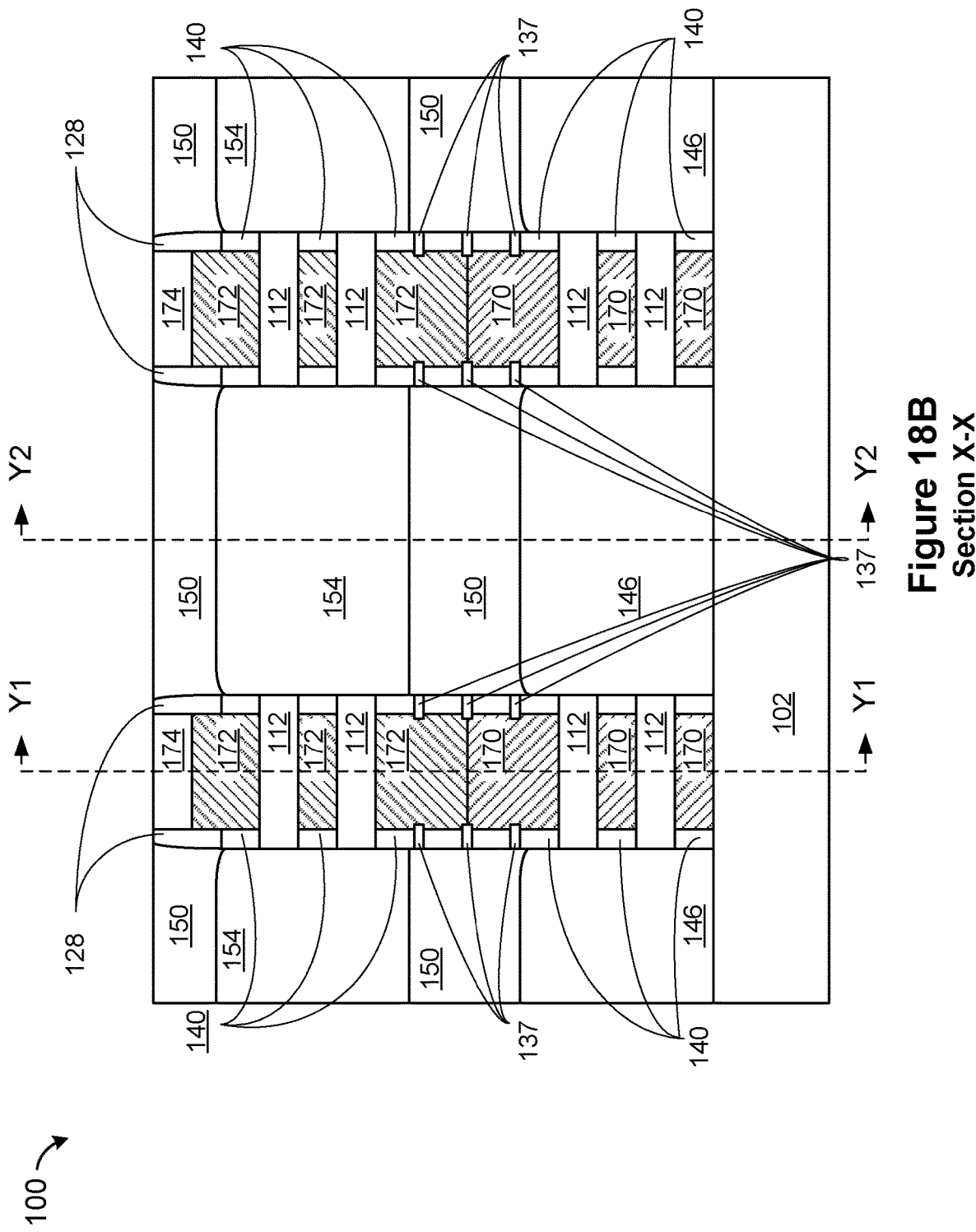
FIG. 18B illustrates a cross-sectional view of the semiconductor structure along section line X-X, according to an alternate embodiment.
Figure 19A:
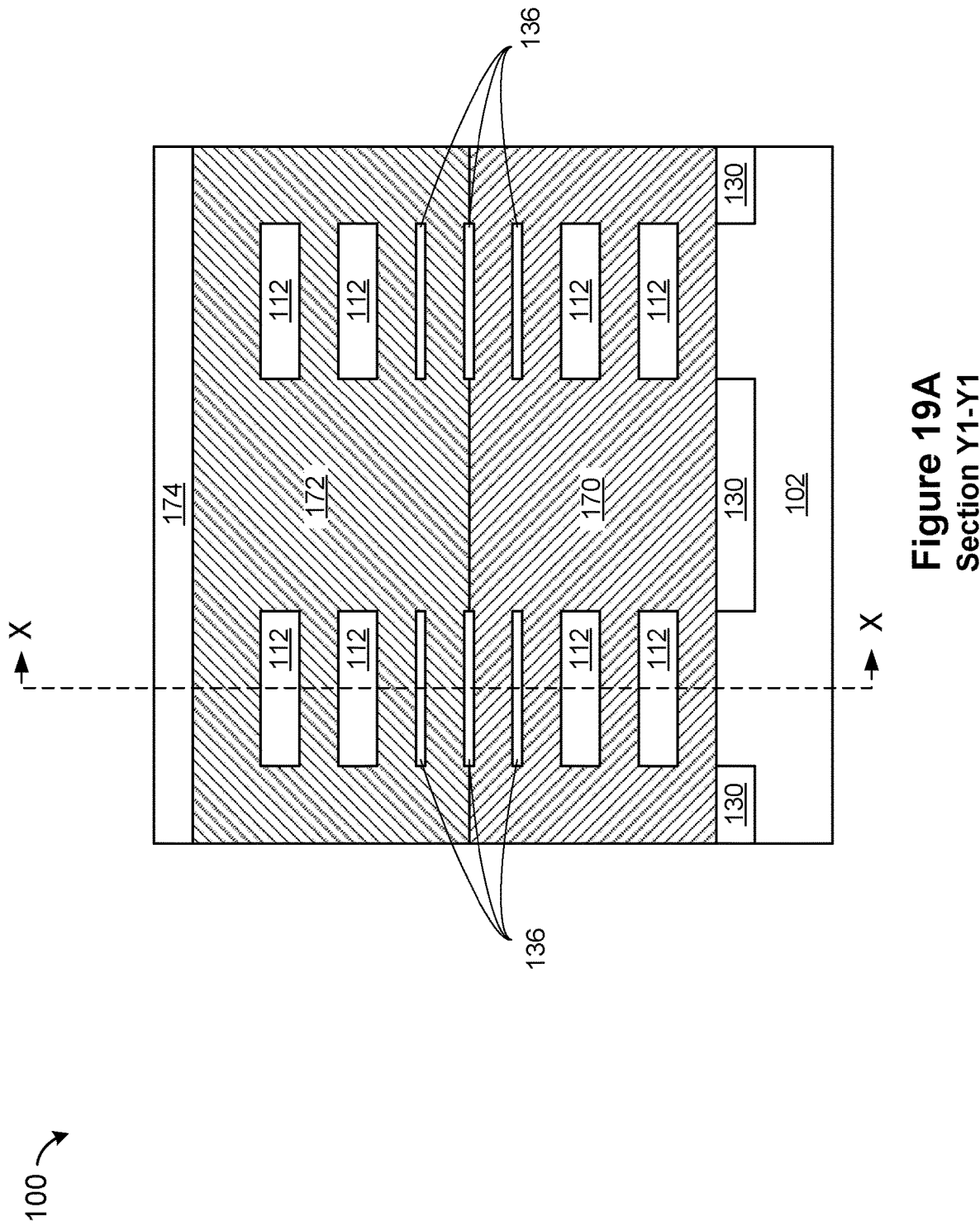
FIG. 19A illustrates a cross-sectional view of the semiconductor structure along section line Y1-Y1, according to an embodiment.
Figure 19B:
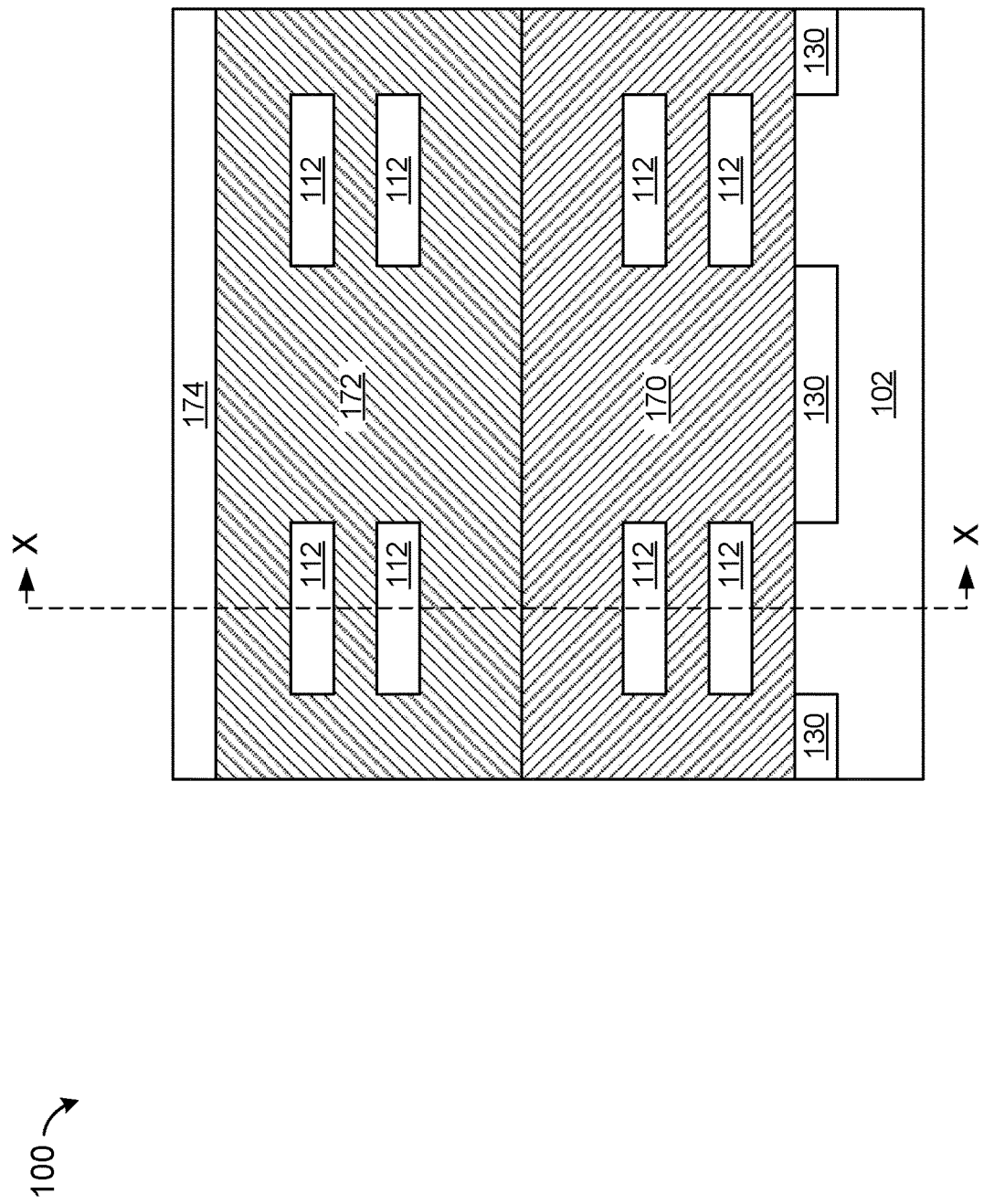
FIG. 19B illustrates a cross-sectional view of the semiconductor structure along section line Y1-Y1, according to an alternate embodiment.
Figure 20:
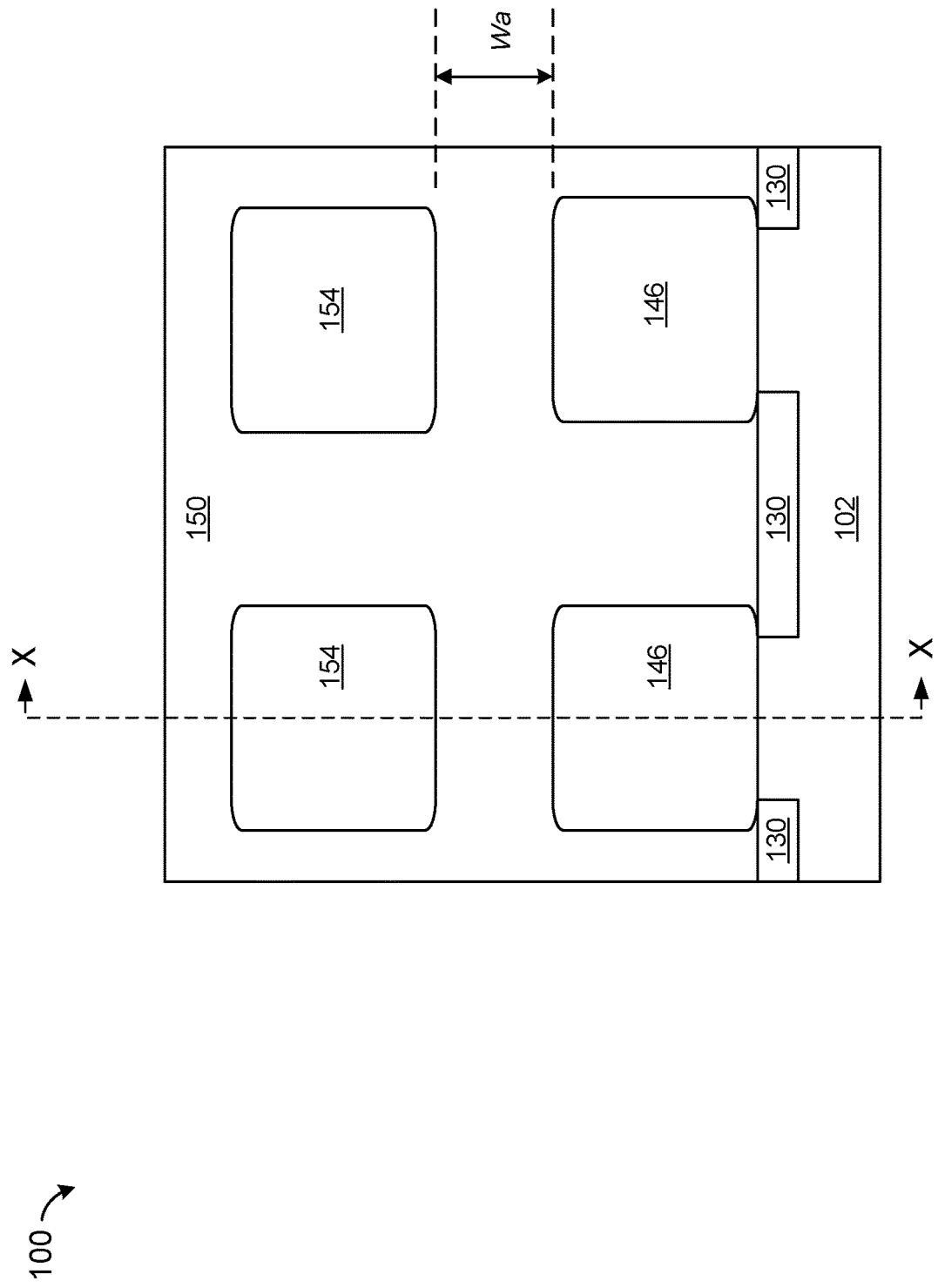
FIG. 20 illustrates a cross-sectional view of the semiconductor structure along section line Y2-Y2, according to an embodiment.

Referring now to FIGS. 18A, 18B, 19A, 19B and 20 the structure 100 is shown according to an exemplary embodiment. FIGS. 18A, 18B, 19A, 19B and 20 are each a cross-sectional view of the structure 100 along section lines X-X, X-X, Y1-Y1, Y1-Y1 and Y2-Y2, respectively. FIGS. 19A, 19B and 20 are parallel to each other, and FIGS. 18A and 18B are perpendicular to FIGS. 19A, 19B and 20. FIG. 20 is a repeat of FIG. 15, which remains unchanged. FIGS. 18B and 19B are an alternative embodiment to FIGS. 18A and 19A.

A first work function metal (hereinafter "first WFM") 170, a second work function metal (hereinafter "second WFM") 172 and a cap 174 may be formed.

The first WFM 170 may be conformally formed on the structure 100, according to an exemplary embodiment. The first WFM 170 is formed in each cavity of the nanosheet stack and surrounding suspended portions of the channel layers 112. The first WFM 170 forms a layer surrounding exposed portions of the nanosheet stacks. The first WFM 170 may cover an exposed upper horizontal surface of the STI 130, an exposed upper horizontal surface of the substrate 102, exposed vertical side surfaces of one side of the side spacers 140 and exposed vertical side surfaces of one side of the gate cap 128. The first WFM 170 may cover vertical side surfaces, an upper horizontal surface and a lower horizontal surface of the channel layers 112. As shown in FIG. 18, the first WFM 170 may cover vertical side surfaces, an upper horizontal surface and a lower horizontal surface of the thin insulator layers 136. In the alternative embodiment of FIG. 18A, the first WFM 170 may fill spaces above, below and between the thin insulator 137. The thin insulator 137 may partially extend into the first WFM 170.

The first WFM 170 may be deposited using typical deposition techniques, for example, atomic layer deposition (ALD), molecular layer deposition (MLD), and chemical vapor deposition (CVD).

In an embodiment, the first WFM 170 may include more than one layer, for example, a conformal layer of a high-k material may be formed prior to the formation of the first WFM 170. The material chosen for the first WFM 170, and any high-k dielectric, may be selected based on a desired threshold voltage, in combination with other materials and properties as described above, for those memory cells where the first WFM 170 surrounds the channel layers 112, and whether the device is a p-FET or n-FET. In an embodiment, the work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the work function metal may include one or more layers to achieve desired device characteristics. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof.

Known techniques may be used to selectively remove portions of the first WFM 170 such that a remaining portion of the first WFM 170 has an upper surface between the lower nanosheet stack and the upper nanosheet stack.

As shown in FIG. 18A, the upper surface of the first WFM 170 may align with a horizontal upper surface of one of the thin insulator layers 136. For example, a wet etching technique may be used to selectively remove portions of the first WFM 170 selective to the channel layers 112, the thin insulator layers 136, the side spacers 140, the substrate 102, the STI 130, the lower source drain 146, the ILD 150, the upper source drain 154 and the gate cap 128.

In the alternate embodiment of FIG. 18B, the first WFM 170 may align with a horizontal upper surface of one of the thin insulator layers 137. For example, a wet etching technique may be used to selectively remove portions of the first WFM 170 selective to the channel layers 112, the thin insulator layers 137, the side spacers 140, the substrate 102, the STI 130, the lower source drain 146, the ILD 150, the upper source drain 154 and the gate cap 128.

A remaining portion of the first WFM 170 remains surrounding the channel layers 112 of the lower nanosheet stack and between the inner spacers 140.

The second WFM 172 may be conformally formed on the structure 100, as described above for the first WFM 170. The second WFM 172 is formed in each exposed cavity of the nanosheet stack and surrounding suspended portions of the channel layers 112. The second WFM 172 forms a layer surrounding exposed portions of the nanosheet stacks. The second WFM 172 may cover exposed vertical side surfaces of one side of the side spacers 140 and exposed vertical side surfaces of one side of the gate cap 128, all of which are exposed above the first WFM 170. The second WFM 172 may cover vertical side surfaces, an upper horizontal surface and a lower horizontal surface of the channel layers 112 above the first WFM 170. As shown in FIG. 18A, the second WFM 172 may cover vertical side surfaces, an upper horizontal surface and a lower horizontal surface of the thin insulator layers 136 above the first WFM 170. In the alternative embodiment of FIG. 18B, the second WFM 172 may fill spaces above, below and between the thin insulator 137. The thin insulator 137 may partially extend into the second WFM 172.

As described above, the material chosen for the second WFM 172, in combination with other materials and properties as described above, may be selected based whether the device is a p-FET or n-FET. In an embodiment, the second WFM 172 may include more than one layer, for example, a conformal layer of a high-k material may be formed prior to the formation of the second WFM 84, also described above.

In an embodiment, the second WFM 172 may include more than one layer, for example, a conformal layer of a high-k material may be formed prior to the formation of the second WFM 172. The material chosen for the second WFM 172, and any high-k dielectric, may be selected based in combination with other materials and properties as described above, and whether the device is a p-FET or n-FET.

The first WFM 170 surrounds the channel layers 112 of the lower nanosheet stack. The second WFM 172 surrounds the channel layers 112 of the upper nanosheet stack. In an embodiment, the first WFM 170 surrounds the channel layers 112 of the upper nanosheet stack, for example, when both the upper and lower nanosheet stacks are n-FET or both are p-FET.

An upper surface of the first WFM 170 may align with a lower surface of the second WFM 172. The upper surface of the first WFM 170 may be at any position which is above the upper most channel layer 112 of the lower nanosheet stack and below the lower most channel layer 112 of the upper nanosheet stack.

The cap 174 may be formed as described for the ILD 150. A chemical mechanical polishing (CMP) technique may be used to remove excess material and polish upper surfaces of the structure 100.

As shown in FIGS. 18A, 18B, 19A and 19B, between the lower nanosheet stack and the upper nanosheet stack the three thin insulators layers 136 help to provide insulation between the upper and lower nanosheet stacks and allows for increased space for formation of different work function metals, the first WFM 170 and the second WFM 172 and associated high k liners for each, for each of the upper and lower nanosheet stacks.

As shown in FIG. 20, a distance Wα between the lower source drain 146 and the upper source drain 154 provides insulated space to prevent an electrical short between the source drain regions of the upper FET of the upper nanosheet stack and the lower FET of the lower nanosheet stack.

Contacts may be formed to the lower source drain 146, the upper source drain 154, the first WFM 170 and the second WFM 172.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:
1. A semiconductor structure comprising:
a bottom nanosheet device comprising a series of bottom channels arranged vertically and surrounded by a bottom work function metal;
a top nanosheet device comprising a series of top channels arranged vertically and surrounded by a top work function metal, the top nanosheet device vertically aligned with and stacked on top of the bottom nanosheet device;

two or more partial insulating layers disposed between the bottom nanosheet device and the top nanosheet device, the two or more partial insulating layers each separated vertically from one another by a series of inner spacers, and each of the two or more partial insulating layers comprises a thickness less than a thickness of any one channel from either the series of bottom channels or the series of top channels;

the bottom work function metal horizontally separating two portions of a first partial insulating layer of the two or more partial insulating layers; and the top work function metal horizontally separating two portions of a second partial insulating layer of the two or more partial insulating layers.

2. The semiconductor structure according to claim 1, wherein
the series of inner spacers is further disposed along vertical side surfaces of the bottom work function metal, and further arranged between and separating each of the bottom channels; and
the series of inner spacers is further arranged between and separating each of the top channels, and further disposed along vertical side surfaces of the top work function metal, wherein first vertical side surfaces of the series of inner spacers are vertically aligned with first vertical side surfaces of the two or more partial insulating layers.

3. The semiconductor structure according to claim 1, wherein
each of the two portions of the first partial insulating layer comprises a width greater than a width of each inner spacer of the series of inner spacers.

4. The semiconductor structure according to claim 1, wherein
the bottom work function metal and the top work function metal comprise the same material.

5. The semiconductor structure according to claim 1, wherein
the bottom work function metal and the top work function metal comprise different materials.

6. The semiconductor structure according to claim 1, further comprising:
a top source drain region in direct contact with ends of each top channel in the series of top channels; and
a bottom source drain region in direct contact with ends of each bottom channel in the series of bottom channels.

7. A semiconductor structure comprising:
a top nanosheet device comprising a series of top channels and a top work function metal stacked on top of and vertically aligned with a bottom nanosheet device comprising a series of bottom channels and a bottom work function metal;
an intermediate region disposed between the top nanosheet device and the bottom nanosheet device, wherein the intermediate region comprises a series of inner spacers each vertically separated from one another by a partial insulating layer of a plurality of partial insulating layers, wherein the bottom work function metal and the top work function metal together horizontally separates two portions of each of the plurality of partial insulating layers, and wherein the plurality of partial insulating layers have a thickness that is less than a thickness of any one channel from the top nanosheet device or the bottom nanosheet device.

8. The semiconductor structure according to claim 7, wherein
the series of bottom channels are arranged vertically and surrounded by the bottom work function metal, and
the series of top channels are arranged vertically and surrounded by the top work function metal.

9. The semiconductor structure according to claim 8, wherein
the series of inner spacers is further arranged between and separating each of the bottom channels, along vertical side surfaces of the bottom work function metal; and
the series of inner spacers is further arranged between and separating each of the top channels, along vertical side surfaces of the top work function metal.

10. The semiconductor structure according to claim 7, wherein
first vertical side surfaces of the series of inner spacers are vertically aligned with first vertical side surfaces of the partial insulating layers.

11. The semiconductor structure according to claim 7, wherein
each of the partial insulating layers comprises a width greater than a width of each spacer of the series of inner spacers.

12. A semiconductor structure comprising:
a bottom nanosheet device comprising a series of bottom channels arranged vertically and surrounded by a bottom work function metal;
a top nanosheet device comprising a series of top channels arranged vertically and surrounded by a top work function metal, the top nanosheet device vertically aligned with and stacked on top of the bottom nanosheet device; and
a bottom intermediate region disposed between the top nanosheet device and the bottom nanosheet device and a top intermediate region disposed between the top nanosheet device and the bottom intermediate region, wherein the bottom intermediate region comprises a first series of inner spacers each vertically separated from one another by a bottom partial insulating layer of a plurality of bottom partial insulating layers, wherein the bottom work function metal horizontally separates two portions of each of the plurality of bottom partial insulating layers, and wherein the plurality of bottom partial insulating layers comprise a thickness that is less than a thickness of any one channel from either the series of bottom channels or the series of top channels.

13. The semiconductor structure according to claim 12, further comprising:
wherein the top intermediate region comprises a second series of inner spacers each vertically separated from one another by a top partial insulating layer, wherein the top work function metal horizontally separates two portions of each top partial insulating layer.

14. The semiconductor structure according to claim 12, further comprising:
a third series of inner spacers being arranged between and separating each of the bottom channels and along vertical side surfaces of the bottom work function metal;
a fourth series of inner spacers being arranged between and separating each of the top channels and along vertical side surfaces of the top work function metal, and wherein first vertical side surfaces of the third series of inner spacers and the fourth series of inner spacers are vertically aligned with first vertical side surfaces of the bottom partial insulating layers of the bottom intermediate region.

15. The semiconductor structure according to claim 12, wherein
each of the bottom partial insulating layers comprises a width greater than a width of the first series of inner spacers.

16. The semiconductor structure according to claim 12, further comprising:
a top source drain region in direct contact with ends of each top channel of the series of top channels; and
a bottom source drain region in direct contact with ends of each bottom channel of the series of bottom channels.

17. The semiconductor structure according to claim 12, wherein
the bottom work function metal and the top work function metal comprise different materials.

* * * * *